US012538629B2

(12) United States Patent
Cha et al.

(10) Patent No.: US 12,538,629 B2
(45) Date of Patent: Jan. 27, 2026

(54) DISPLAY DEVICE WITH REDUCED PARASITIC CAPACITANCE

(71) Applicant: Samsung Display Co., LTD., Yongin-si (KR)

(72) Inventors: Na Hyeon Cha, Yongin-si (KR); Sun Kwun Son, Yongin-si (KR); Dong Hee Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 660 days.

(21) Appl. No.: 17/881,184

(22) Filed: Aug. 4, 2022

(65) Prior Publication Data

US 2023/0040741 A1 Feb. 9, 2023

(30) Foreign Application Priority Data

Aug. 5, 2021 (KR) ........................ 10-2021-0103379

(51) Int. Cl.
*H10H 29/14* (2025.01)
*G09G 3/32* (2016.01)
*H10H 20/821* (2025.01)

(52) U.S. Cl.
CPC ............. *H10H 29/142* (2025.01); *G09G 3/32* (2013.01); *H10H 20/821* (2025.01); (Continued)

(58) Field of Classification Search
CPC .... H10H 29/142; H10H 29/32; H10H 29/352; G09G 2300/0426; G09G 2300/0267; G09G 2300/0295
See application file for complete search history.

(56) References Cited

U.S. PATENT DOCUMENTS 7,692,617 B2 4/2010 Kim et al.
9,029,846 B2 5/2015 Song et al.
(Continued)

FOREIGN PATENT DOCUMENTS

KR 10-1160822 6/2012
KR 10-2019-0009217 1/2019
(Continued)

OTHER PUBLICATIONS

International Search Report corresponding to International Application No. PCT/KR2022/011496 dated Nov. 9, 2022.

*Primary Examiner* — William B Partridge
*Assistant Examiner* — Gustavo G Ramallo
(74) *Attorney, Agent, or Firm* — Womble Bond Dickinson (US) LLP

(57) ABSTRACT

A display device includes pixels including a first pixel and a second pixel sequentially disposed in a first direction, each including sub-pixels including a first electrode, a second electrode, and a light emitting element, a driving circuit including driving elements between the pixels, pixel lines connected to the pixels, and driving lines connected to the driving elements. The driving lines are in an area between the first pixel and the second pixel, and include a first driving line extending in a second direction intersecting the first direction in the area between the first pixel and the second pixel. First electrodes included in the sub-pixels of the first pixel and first electrodes included in the sub-pixels of the second pixel are spaced apart by a distance equal to or greater than a width of the first driving line in the first direction, and do not overlap the first driving line.

20 Claims, 18 Drawing Sheets

(52) U.S. Cl.
CPC ............... *G09G 2300/0426* (2013.01); *G09G 2300/0819* (2013.01); *G09G 2300/0842* (2013.01); *G09G 2310/0267* (2013.01)

(56) References Cited

U.S. PATENT DOCUMENTS

| | | | | |
|---|---|---|---|---|
| 11,616,106 | B2 | 3/2023 | Kim et al. | |
| 2008/0218462 | A1* | 9/2008 | Murai | G09G 3/3611 345/89 |
| 2020/0066787 | A1* | 2/2020 | Park | H10H 29/142 |
| 2020/0403131 | A1 | 12/2020 | Kim et al. | |
| 2021/0296424 | A1 | 9/2021 | Cho et al. | |
| 2021/0384252 | A1* | 12/2021 | Lee | H10H 20/84 |

FOREIGN PATENT DOCUMENTS

| | | |
|---|---|---|
| KR | 10-2020-0017012 | 2/2020 |
| KR | 10-2080011 | 2/2020 |
| KR | 10-2020-0037911 | 4/2020 |
| KR | 10-2020-0115852 | 10/2020 |
| KR | 10-2021-0094817 | 7/2021 |
| WO | 2019/225708 | 11/2019 |

* cited by examiner

PXL: PXL1, PXL2, PXL3
PXA: PXA1, PXA2, PXA3
EMU: EMU1, EMU2, EMU3
LD: LD1, LD2

DISPLAY DEVICE WITH REDUCED PARASITIC CAPACITANCE

CROSS-REFERENCE TO RELATED APPLICATION(S)

This application claims priority to and benefits of Korean Patent Application No. 10-2021-0103379 under 35 U.S.C. § 119, filed on Aug. 5, 2021 in the Korean Intellectual Property Office, the entire contents of which are incorporated herein by reference.

BACKGROUND

1. Technical Field

An embodiment of the disclosure relates to a display device.

2. Description of the Related Art

Recently, interest in information display is increasing. Accordingly, research and development of a display device has been continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device capable of reducing a non-display area and improving image quality.

The objects of the disclosure are not limited to the above-described objects, and other objects will be clearly understood by those skilled in the art from the following description.

A display device according to an embodiment may include pixels including a first pixel; and a second pixel sequentially disposed in a first direction, each of the first pixel and the second pixel including sub-pixels, each of the sub-pixels including a first electrode; a second electrode; and a light emitting element; a driving circuit including driving elements disposed between the pixels; pixel lines electrically connected to the pixels; and driving lines electrically connected to the driving elements. The driving lines may be disposed in an area between the first pixel and the second pixel, the driving lines may include a first driving line extending in a second direction intersecting the first direction in the area between the first pixel and the second pixel. First electrodes included in the sub-pixels of the first pixel and first electrodes included in the sub-pixels of the second pixel may be spaced apart from each other by a distance equal to or greater than a width of the first driving line in the first direction, and the first electrodes included in the sub-pixels of the first pixel and the first electrodes included in the sub-pixels of the second pixel may not overlap the first driving line in a plan view.

In an embodiment, the first electrodes of the sub-pixels may be connected to pixel circuits of the sub-pixels, respectively.

In an embodiment, the first electrodes of the sub-pixels may extend in the first direction in pixel areas.

In an embodiment, second electrodes of the sub-pixels may extend in the first direction and face the first electrodes of the sub-pixels, respectively, and the second electrodes of the sub-pixels may be commonly electrically connected to a pixel power line.

In an embodiment, the second electrodes of adjacent ones of the sub-pixels in the first direction may be an integrated electrode.

In an embodiment, the driving lines may include a second driving line, disposed around the first driving line, passing through the area between the first pixel and the second pixel, and extending in the second direction in the area between the first pixel and the second pixel.

In an embodiment, the first electrodes of the sub-pixels sequentially disposed in the first direction may be spaced apart from each other with the first driving line and the second driving line disposed between the first electrodes of the sub-pixels in the first direction, and the first electrodes of the sub-pixels sequentially disposed in the first direction may not overlap the first driving line and the second driving line in a plan view.

In an embodiment, each of the first driving line and the second driving line may be in a mesh line including a first sub-line extending in the first direction and a second sub-line extending in the second direction.

In an embodiment, the driving circuit may include a first driving element and a second driving element disposed around the first pixel and the second pixel.

In an embodiment, the first driving line may be electrically connected to the first driving element, and the second driving line may be electrically connected to the second driving element.

In an embodiment, the pixel lines may include scan lines and data lines of the pixels, and the driving circuit may include a scan driver including stage circuits electrically connected to the scan lines.

In an embodiment, the driving elements may include transistors and capacitors forming the stage circuits, and may be distributed in an area between the pixels.

In an embodiment, the driving lines may include input signal lines and power lines of the scan driver.

In an embodiment, each of the driving lines may be disposed in at least one of an area between at least two adjacent ones of the pixels in the first direction and an area between at least two adjacent ones of the pixels in the second direction.

In an embodiment, the display device may further include a connection line electrically connected between at least two driving elements among the driving elements.

In an embodiment, the connection line may pass through an area between at least two adjacent ones of the pixels in the first direction, and the connection line may extend in the second direction.

In an embodiment, the first electrodes of the pixels disposed around the connection line may not overlap the connection line in a plan view.

In an embodiment, each of the driving elements may be disposed between at least two adjacent ones of the pixels in the second direction.

In an embodiment, the first electrode and the second electrode of each of the sub-pixels may extend in the first direction and may be spaced apart from each other in the second direction, and the light emitting element of each of the sub-pixels may include a first end electrically connected to the first electrode; and a second end electrically connected to the second electrode.

A display device according to an embodiment may include pixels each including a sub-pixel including a first electrode; a second electrode; and a light emitting element disposed between the first electrode and the second electrode; scan lines electrically connected to the pixels; a scan driver including driving elements disposed between the pixels, and the scan driver outputting scan signals to the scan lines; and driving lines electrically connected to the driving elements. The driving lines may include a first driving line passing through an area between two adjacent ones of the pixels in a first direction and extending in a second direction intersecting the first direction, and first electrodes of the two adjacent ones of the pixels in the first direction may be spaced apart from each other by a distance equal to or greater than a width of the first driving line in the first direction and may not overlap the first driving line in a plan view.

Details of other embodiments are included in the detailed description and drawings.

According to embodiments of the disclosure, the driving elements of the driving circuit may be disposed between the pixels. Accordingly, a manufacturing cost of the display device may be reduced and a non-display area may be reduced.

According to embodiments, the first electrodes of the pixels may be disposed so that the first electrodes of the pixels and the lines of the driving circuit do not intersect. Therefore, a parasitic capacitance formed between the first electrodes of the pixels and the lines of the driving circuit may be reduce or prevent, and a deviation of the parasitic capacitance formed in pixels may be reduced or prevented. Accordingly, a characteristic deviation of the pixels may be reduced or prevented, and image quality of the display device may be improved.

Embodiments are not limited by the contents illustrated above, and more various effects are included in the specification.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
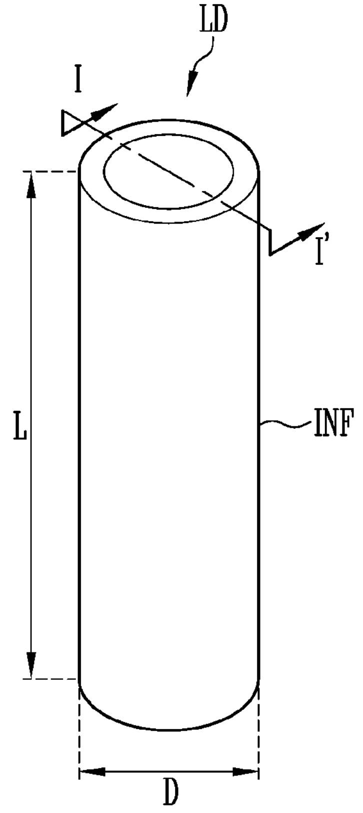
FIG. 1 is a schematic perspective view illustrating a light emitting element according to an embodiment.

The disclosure may be modified in various ways and may have various forms, and embodiments will be illustrated in the drawings and described in detail herein. In the following description, the singular forms also include the plural forms unless the context clearly includes the singular. For example, as used herein, the singular forms, "a," "an," and "the" are intended to include the plural forms as well, unless the context clearly indicates otherwise.

The disclosure is not limited to the embodiments disclosed below, and may be modified in various forms and may be implemented in various ways. In addition, each of the embodiments disclosed below may be implemented alone or in combination with at least one of other embodiments.

In the drawings, some components which may not be directly related to a characteristic of the disclosure may be omitted to clearly represent the disclosure. Throughout the drawings, the same or similar components will be given by the same reference numerals and symbols as much as possible even though they are shown in different drawings, and repetitive descriptions may be omitted.

In describing embodiments, the term "connection (or)" may mean a physical and/or electrical connection (or coupling). In addition, the term "connection (or coupling)" may mean a direct connection (or coupling) and an indirect connection (or coupling), and may mean an integral connection (or coupling) and a non-integral connection (or coupling).

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
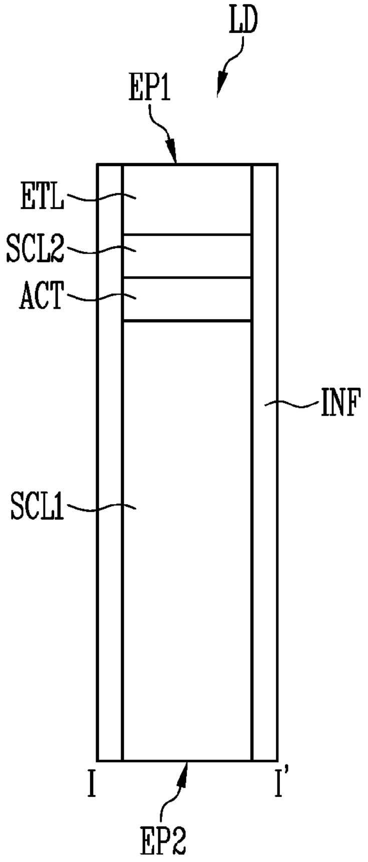
FIG. 2 is a schematic cross-sectional view illustrating a light emitting element according to an embodiment.

FIG. 1 is a schematic perspective view illustrating a light emitting element LD according to an embodiment. FIG. 2 is a schematic cross-sectional view illustrating a light emitting element LD according to an embodiment. For example, FIG. 1 illustrates an example of the light emitting element LD that may be used as a light source of a display device according to an embodiment of the disclosure, and FIG. 2 illustrates an example of a cross-section of the light emitting element LD corresponding to line I~I' of FIG. 1.

Referring to FIGS. 1 and 2, the light emitting element LD may include a first semiconductor layer SCL1, an active layer ACT, and a second semiconductor layer SCL2, which are sequentially disposed along one direction or a direction (for example, a length direction), and an insulating film INF surrounding an outer circumferential surface (for example, a side surface) of the first semiconductor layer SCL1, the active layer ACT, and the second semiconductor layer SCL2. The light emitting element LD may selectively further include an electrode layer ETL disposed on the second semiconductor layer SCL2. The insulating film INF may or may not at least partially surround an outer circumferential surface of the electrode layer ETL. According to an embodiment, the light emitting element LD may further include another electrode layer disposed on one surface or a surface (for example, a lower surface) of the first semiconductor layer SCL1.

In an embodiment, the light emitting element LD is provided (or disposed) in a bar (or rod) shape extending along one direction or a direction, and may have a first end EP1 and a second end EP2 at both ends of a length direction (or a thickness direction). The first end EP1 may include a first bottom surface (or an upper surface) and/or a peripheral region thereof of the light emitting element LD, and the second end EP2 may include a second bottom surface (or a lower surface) and/or a peripheral region thereof of the light emitting element LD. For example, the electrode layer ETL and/or the second semiconductor layer SCL2 may be disposed on the first end EP1 of the light emitting element LD, and the first semiconductor layer SCL1 and/or at least one electrode layer connected to the first semiconductor layer SCL1 may be disposed on the second end EP2 of the light emitting element LD.

In describing an embodiment of the disclosure, the term "bar shape" may include a rod-like shape or a bar-like shape having an aspect ratio greater than 1, such as a circular column or a polygonal column, and a shape of a cross section thereof is not particularly limited. For example, a length L of the light emitting element LD may be greater than a diameter D (or a width of the cross section) thereof. It is to be understood that the shapes disclosed herein may include shapes substantially identical or similar to the shapes.

The first semiconductor layer SCL1, the active layer ACT, the second semiconductor layer SCL2, and the electrode layer ETL may be sequentially disposed in a direction from the second end EP2 to the first end EP1 of the light emitting element LD. For example, the first semiconductor layer SCL1 may be disposed on the second end EP2 of the light emitting element LD, and the electrode layer ETL may be disposed on the first end EP1 of the light emitting element LD. For example, at least one other electrode layer may be disposed on the second end EP2 of the light emitting element LD.

The first semiconductor layer SCL1 may be a semiconductor layer of a first conductivity type. For example, the first semiconductor layer SCL1 may be an N-type semiconductor layer including an N-type dopant. For example, the first semiconductor layer SCL1 may include any one semiconductor material among InAlGaN, GaN, AlGaN, InGaN, AlN, and InN, and may be an N-type semiconductor layer doped with a dopant such as Si, Ge, or Sn. However, the material forming the first semiconductor layer SCL1 is not limited thereto, and various materials in addition to the above-described materials may form the first semiconductor layer SCL1.

The active layer ACT may be disposed on the first semiconductor layer SCL1 and may be formed in a single-quantum well or multi-quantum well structure. A position of the active layer ACT may be variously changed according to a type of the light emitting element LD. In an embodiment, the active layer ACT may emit light having a wavelength of about 400 nm to 900 nm, and may have a double hetero-structure.

A clad layer (not shown) doped with a conductive dopant may be selectively formed on and/or under or below the active layer ACT. For example, the clad layer may be formed of an AlGaN layer or an InAlGaN layer. According to an embodiment, a material such as AlGaN or AlInGaN may be used to form the active layer ACT, and various materials in addition to the above-described materials may form the active layer ACT.

In case that a voltage equal to or greater than a threshold voltage is applied to both ends of the light emitting element LD, the light emitting element LD emits light while electron-hole pairs are combined in the active layer ACT. By controlling light emission of the light emitting element LD using this principle, the light emitting element LD may be used as a light source of various light emitting devices including a pixel of a display device.

The second semiconductor layer SCL2 may be disposed on the active layer ACT and may be a semiconductor layer of a second conductive type different from that of the first semiconductor layer SCL1. For example, the second semiconductor layer SCL2 may include a P-type semiconductor layer including a P-type dopant. For example, the second semiconductor layer SCL2 may include at least one semiconductor material among InAlGaN, GaN, AlGaN, InGaN, AlN, and InN, and may be a P-type semiconductor layer doped with a dopant such as Mg. However, the material forming the second semiconductor layer SCL2 is not limited thereto, and various materials in addition to the above-described materials may form the second semiconductor layer SCL2.

In an embodiment, the first semiconductor layer SCL1 and the second semiconductor layer SCL2 may have different lengths (or thicknesses) in the length direction of the light emitting element LD. For example, the first semiconductor layer SCL1 may have a length (or a thickness) longer (or thicker) than that of the second semiconductor layer SCL2 along the length direction of the light emitting element LD. Accordingly, the active layer ACT may be positioned closer to the first end EP1 (for example, a P-type end) than the second end EP2 (for example, an N-type end).

The electrode layer ETL may be disposed on the second semiconductor layer SCL2. The electrode layer ETL may protect the second semiconductor layer SCL2, and may be an electrode for smoothly connecting the second semiconductor layer SCL2 to an electrode, a line, or the like within the spirit and the scope of the disclosure. For example, the electrode layer ETL may be an ohmic contact electrode or a Schottky contact electrode.

In an embodiment, the electrode layer ETL may be substantially translucent. Accordingly, light generated by the light emitting element LD may pass through the electrode layer ETL and may be emitted from the first end EP1 of the light emitting element LD.

In an embodiment, the electrode layer ETL may include metal or metal oxide. For example, the electrode layer ETL may be formed using metal such as chromium (Cr), titanium (Ti), aluminum (Al), gold (Au), nickel (Ni), or copper (Cu), oxide or alloy thereof, a transparent conductive material such as indium tin oxide (ITO), indium zinc oxide (IZO), indium tin zinc oxide (ITZO), zinc oxide (ZnO), or indium oxide (In2O3), and the like alone or in combination.

The insulating film INF may expose the electrode layer ETL (or the second semiconductor layer SCL2) and the first semiconductor layer SCL1 (or another electrode layer provided (or disposed) on the second end EP2 of the light emitting element LD), respectively, at the first and second ends EP1 and EP2 of the light emitting element LD.

In case that the insulating film INF is provided (or disposed) to cover or overlap a surface of the light emitting element LD, for example, the outer circumferential surface of the first semiconductor layer SCL1, the active layer ACT, the second semiconductor layer SCL2, and/or the electrode layer ETL, a short defect through the light emitting element LD may be prevented. Accordingly, electrical stability of the light emitting element LD may be secured. In case that the insulating film INF is provided (or disposed) on a surface of the light emitting element LD, a surface defect of the light emitting element LD may be minimized, and thus a lifespan and efficiency may be improved.

In an embodiment, the light emitting element LD may be manufactured through a surface treatment process. For example, by performing the surface treatment on the light emitting element LD using a hydrophobic material, in case that light emitting elements LD are mixed in a fluid solution (hereinafter referred to as a "light emitting element mixed liquid" or an "light emitting element ink") and supplied to each emission area (for example, an emission area of a pixel), the light emitting elements LD may be uniformly dispersed in the light emitting element mixed liquid without being non-uniformly aggregated.

The insulating film INF may include a transparent insulating material. Accordingly, light generated in the active layer ACT may pass through the insulating film INF and may be emitted to the outside of the light emitting element LD. For example, the insulating film INF may include at least one insulating material among silicon oxide (SiOx) (for example, SiO2), silicon nitride (SiNx) (for example, Si3N4), aluminum oxide (AlxOy) (for example, Al2O3), titanium oxide (TixOy) (for example, TiO2), and hafnium oxide (HfOx), but is not limited thereto.

The insulating film INF may be a single layer or multiple layers. For example, the insulating film INF may be formed of a double film.

In an embodiment, the insulating film INF may be partially etched (or removed) in a region corresponding to at least one of the first end EP1 and the second end EP2 of the light emitting element LD. For example, the insulating film INF may be etched to have a rounded shape in the first end EP1, but the shape of the insulating film INF is not limited thereto.

In an embodiment, the light emitting element LD may have a small size of a range from nanometer (nm) to micrometer (μm). For example, each light emitting element LD may have the diameter D (or a width of a cross section) and/or the length L of the range from nanometer to micrometer. For example, the light emitting element LD may have the diameter D and/or the length L of a range of approximately several tens of nanometers to several tens of micrometers. However, a size of the light emitting element LD may be changed.

A structure, a shape, a size, and/or a type of the light emitting element LD may be changed according to an embodiment. For example, the light emitting element LD may be formed in another structure and/or shape such as a core-shell structure.

A light emitting device including the light emitting element LD may be used in various types of devices that require a light source. For example, the light emitting elements LD may be disposed in the pixel of the display device, and the light emitting elements LD may be used as a light source of the pixel. The light emitting element LD may be used in other types of devices that require a light source, such as a lighting device.

Figure 3:
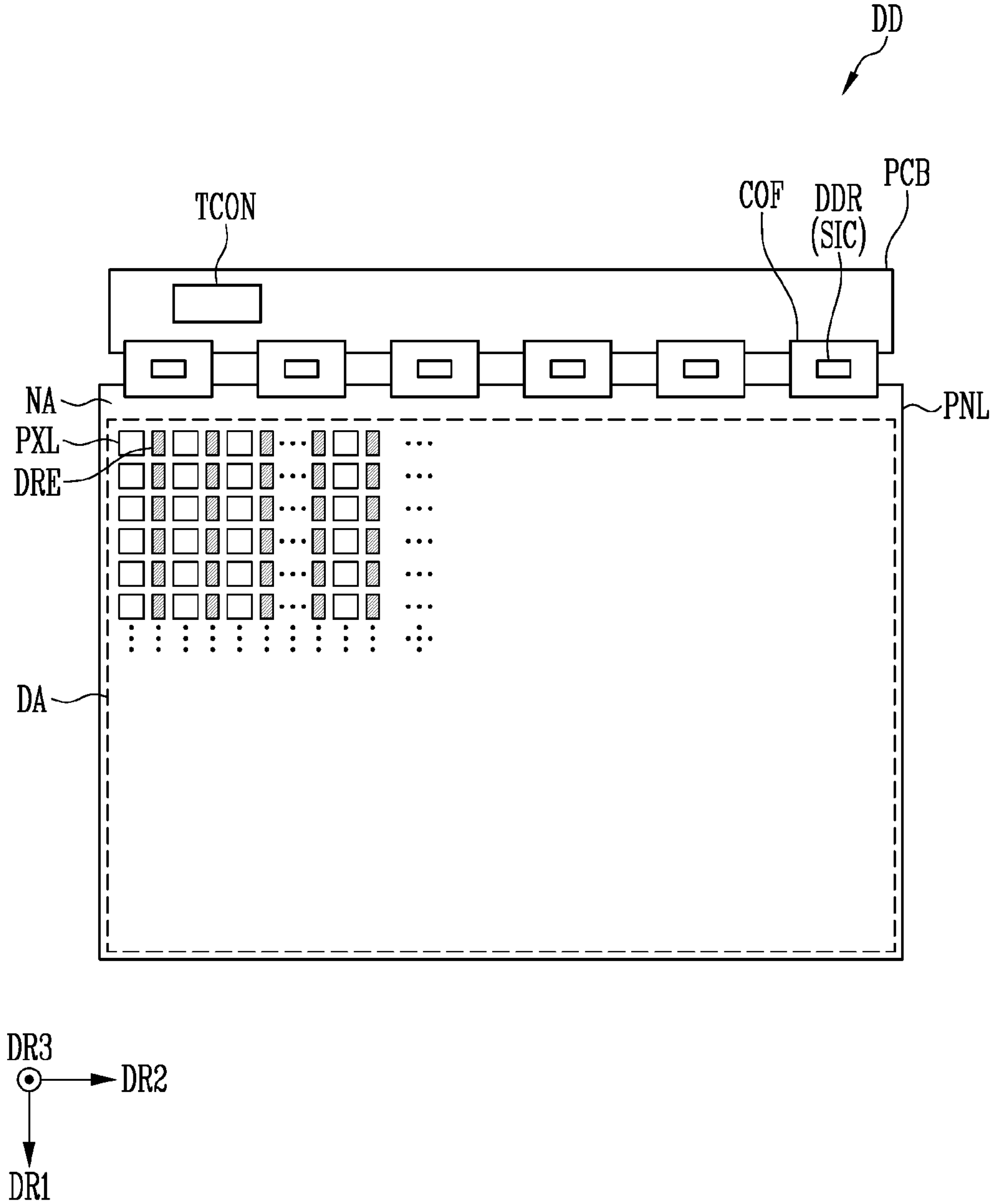
FIGS. 3 and 4 are schematic plan views illustrating a display device according to an embodiment, respectively.
Figure 4:
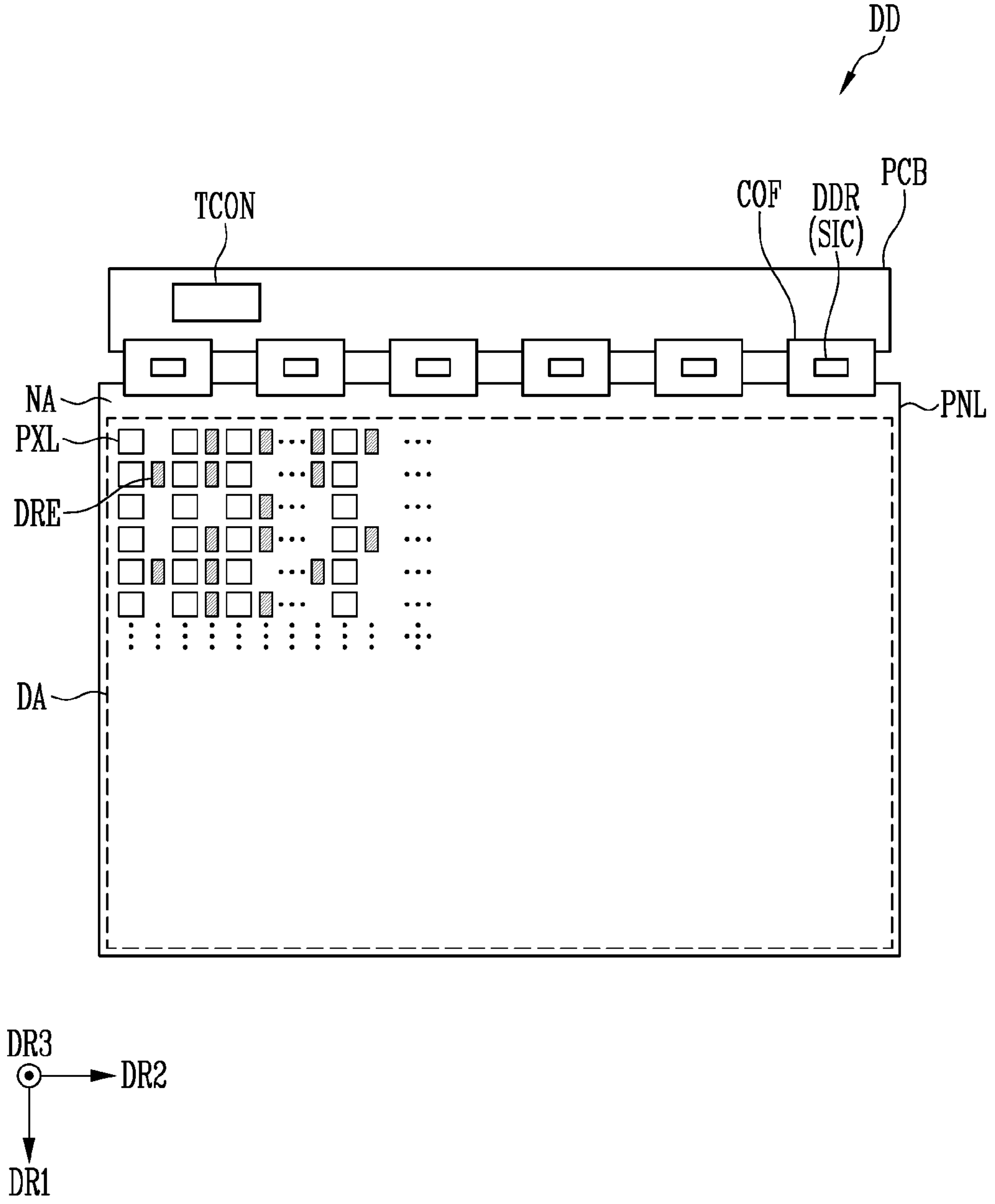

FIGS. 3 and 4 are schematic plan views illustrating a display device DD according to an embodiment of the disclosure, respectively. FIGS. 3 and 4 illustrate different embodiments in relation to a disposition of driving elements DRE disposed in a display area DA.

Referring to FIGS. 3 and 4, the display device DD may include a display panel PNL including pixels PXL. The display device DD may include a driving circuit for driving the pixels PXL.

In an embodiment, at least a portion of the driving circuit may be provided (or disposed) in the display panel PNL together with the pixels PXL. For example, the driving circuit may include the driving elements DRE (for example, circuit elements forming at least one driving circuit) disposed between the pixels PXL.

The display panel PNL may include the display area DA in which the pixels PXL may be provided, and a non-display area NA positioned (or disposed) around or adjacent to the display area DA. The display panel PNL and the display device DD including the same may have various shapes. For example, the display panel PNL may be provided (or disposed) in a plate shape having a quadrangle shape, and may include an angled or rounded corner portion. The display panel PNL may have other shapes. For example, the display panel PNL may have another polygonal shape such as a hexagon or an octagon when viewed in a plan view, or may have a shape including a curved perimeter such as a circle or an ellipse.

In FIGS. 3 and 4, the display panel PNL has a quadrangular plate shape. A vertical direction (for example, a column direction) and a horizontal direction (for example, a row direction) of the display panel PNL (or the display device DD including the display panel PNL) is defined as a first direction DR1 and a second direction DR2, respectively, and a thickness direction (or a height direction) of the display panel PNL (or the display device DD including the display panel PNL) is defined as a third direction DR3.

The pixels PXL may be disposed in the display area DA. The pixels PXL may be connected to respective pixel lines (for example, scan lines, data lines, a first pixel power line, and a second pixel power line), and may receive driving signals (for example, a scan signal and a data signal) from the pixel lines and driving power (for example, first pixel power and second pixel power). In an embodiment, each pixel PXL may include sub-pixels emitting light of different colors. By controlling a luminance of light emitted from the sub-pixels of each pixel PXL, a color and a luminance of the light emitted from the pixel PXL may be controlled.

The driving circuit may include a gate driver (for example, a scan driver) and a data driver DDR for supplying gate signals (for example, scan signals) and data signals to the pixels PXL. The driving circuit may include a timing controller TCON for controlling the gate driver and the data driver DDR.

The gate driver may generate gate signals in response to a gate control signal supplied from the timing controller TCON. The gate driver may be connected to the pixels PXL through gate lines, and may supply respective gate signals to the pixels PXL through the gate lines.

In an embodiment, the gate lines may include the scan lines of pixels, and the gate driver may include the scan driver that outputs respective scan signals to the scan lines. The scan driver may include stage circuits for sequentially outputting the scan signals to the scan lines. For example, the scan driver may include at least one shift register including stage circuits. In an embodiment, the gate lines may further include control lines for supplying different types of control signals for controlling an operation of the pixels PXL.

The data driver DDR may generate data signals in response to image data and a data control signal supplied from the timing controller TCON. The data driver DDR may be connected to the pixels PXL through data lines, and may supply respective data signals to the pixels PXL through the data lines.

The timing controller TCON may control the operation of the gate driver by supplying the gate control signal to the gate driver. The timing controller TCON may control an operation of the data driver DDR by supplying the image data and the data control signal to the data driver DDR.

At least a portion of the driving circuit, for example, the gate driver, may include the driving elements DRE disposed between the pixels PXL. For example, the gate driver may be provided (or disposed) in the display area DA together with the pixels PXL. For example, the gate driver may include the scan driver including stage circuits sequentially outputting the scan signals, and the driving elements DRE (for example, transistors and capacitors forming each stage circuit) forming the stage circuits of the scan driver may be dispersedly disposed between the pixels PXL. Each driving element DRE may be disposed between at least two pixels PXL adjacent to each other in the second direction DR2.

In an embodiment, the driving elements DRE may be uniformly and/or regularly distributed in the display area DA as in the embodiment of FIG. 3. In an embodiment, the driving elements DRE may be non-uniformly and/or irregularly distributed in the display area DA as in the embodiment of FIG. 4. The driving elements DRE may be disposed in the display area DA in various shapes according to an embodiment.

In case that the gate driver is formed (or disposed) inside of the display panel PNL, a separate gate driver IC may not be required to be provided, and thus a manufacturing cost of the display device DD may be reduced. In case that the gate driver is formed inside the display area DA, the non-display area NA of the display panel PNL may be reduced. For example, as the gate driver is formed inside the display area DA, a gate fan-in/out area may be removed, and the non-display area NA in left and right areas of the display panel PNL may be effectively reduced or removed.

A remaining portion of the driving circuit, for example, the data driver DDR and the timing controller TCON may be provided (or disposed) outside of the display area DA. In an embodiment, the data driver DDR may include at least one source drive IC SIC mounted on each connection film COF, and may be electrically connected to the pixels PXL of the display panel PNL through the connection film COF. Each connection film COF may be electrically connected to the pixels PXL through pads formed in the non-display area NA of the display panel PNL. For example, the data driver DDR may be mounted on the non-display area NA of the display panel PNL through a chip on glass (COG) process. In an embodiment, the timing controller TCON may be mounted on a circuit board PCB, and may be electrically connected to the gate driver and the data driver DDR through the circuit board PCB and at least one connection film COF.

In an embodiment, the data driver DDR may be provided and/or disposed on only one side or a side of the display panel PNL so as to be adjacent to any one side or a side of the display area DA. For example, the connection films COF on which the source drive ICs SIC are mounted may be disposed on the non-display area NA adjacent to an upper area (or a lower area) of the display area DA. In a remaining area except for the area in which the data driver DDR is positioned of the non-display area NA of the display panel PNL, for example, in the non-display areas NA adjacent to left, right, and lower areas of the display area DA, a driving circuit (or a connection portion for connection to the driving circuit) may not be positioned. Accordingly, the non-display area NA may be effectively reduced or removed in the left, right, and lower areas of the display panel PNL.

Figure 5:
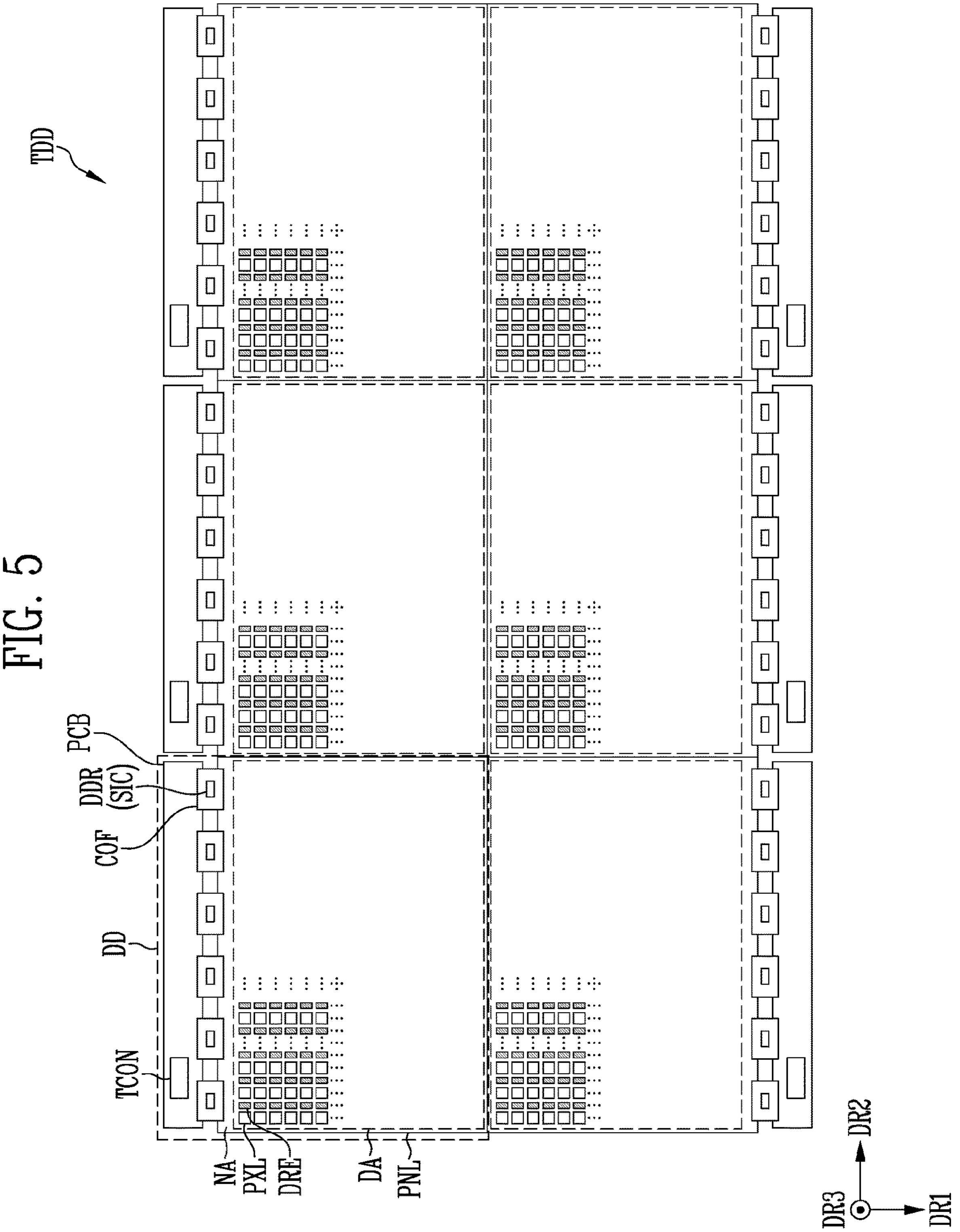
FIG. 5 is a schematic plan view illustrating a tiling display device according to an embodiment.

FIG. 5 is a schematic plan view illustrating a tiling display device TDD according to an embodiment of the disclosure. For example, FIG. 5 illustrates the tiling display device TDD using the display device DD of FIG. 3.

Referring to FIGS. 3 to 5, the tiling display TDD of a larger screen may be formed using display devices DD. For example, by arranging the display devices DD in the first direction DR1 and/or the second direction DR2, the tiling display device DD implementing an extra-large screen may be formed. The display devices DD may display images that are separate and/or independent from each other, or may display images connected to each other in the display devices DD.

In an embodiment, each display device DD forming the tiling display device TDD may include a driving circuit provided (or disposed) only on one side or a side corresponding to the inside of the display area DA and/or one side or a side of the display panel PNL. In other side surfaces where the driving circuit is not provided, the non-display area NA of the display devices DD may have a reduced and/or minimized width. As described above, in case that the display devices DD are closely disposed so that the non-display areas NA having the reduced and/or minimized width of the non-display area NA are adjacent to each other, recognition of a boundary between the display devices DD may be prevented or minimized. Accordingly, a seamless tiling display device TDD may be formed.

Figure 6:
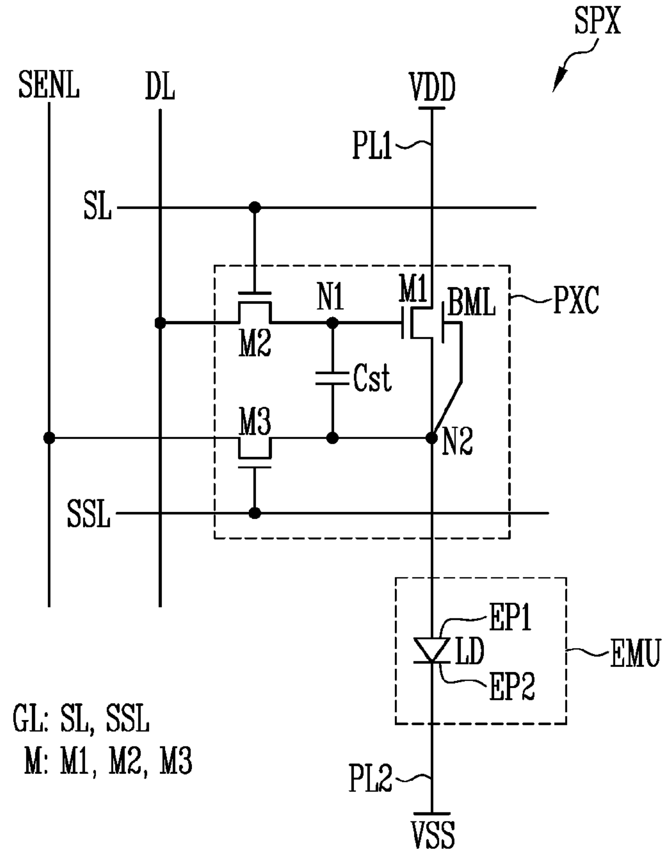
FIGS. 6 and 7 are schematic diagrams of equivalent circuits illustrating a sub-pixel according to an embodiment, respectively.
Figure 7:
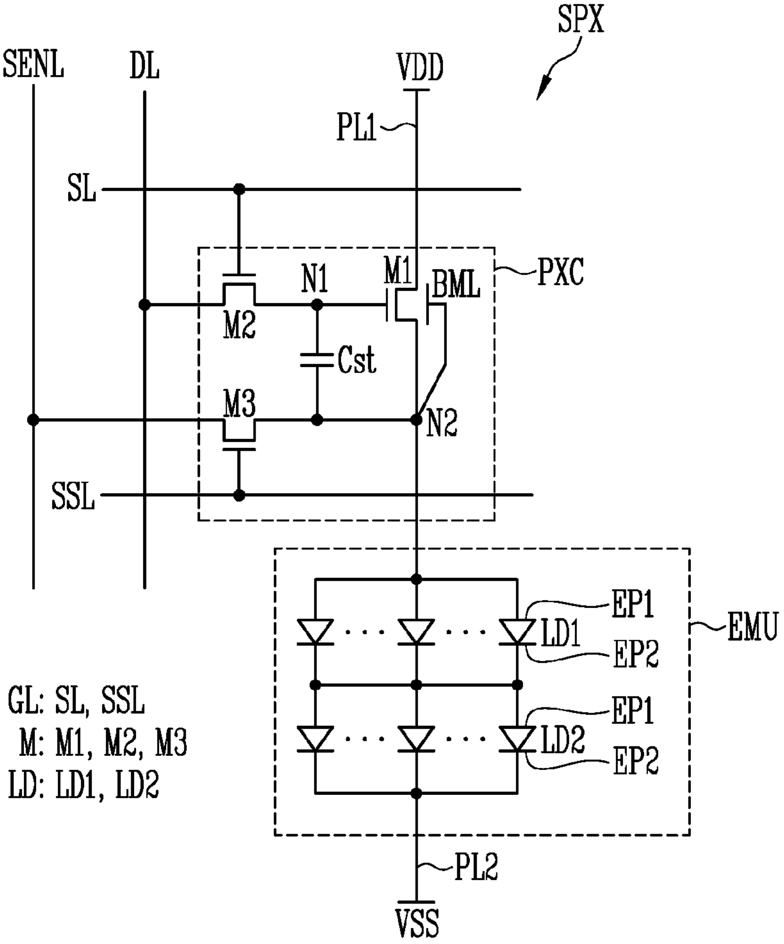

FIGS. 6 and 7 are schematic diagrams of equivalent circuits illustrating a sub-pixel SPX according to an embodiment of the disclosure, respectively. FIGS. 6 and 7 illustrate different embodiments in relation to a light emitting unit EMU (or light emitting part) of the sub-pixel SPX.

The sub-pixel SPX shown in FIG. 6 or 7 may be included in any one of the pixels PXL shown in FIGS. 3 to 5. The pixels PXL disposed in the display area DA and/or the sub-pixels SPX forming the pixels PXL may have substantially the same or similar structure to each other.

Referring to FIGS. 6 and 7, the sub-pixel SPX may be connected to pixel lines. The pixel lines may include at least one gate line GL for transmitting respective gate signals to the sub-pixel SPX (or the pixel PXL including the sub-pixel SPX), a data line DL (or sub-data line) for transmitting the data signal to the sub-pixel SPX, a first pixel power line PL1 (also referred to as a "first power line") for transmitting a voltage of a first pixel power source VDD to the sub-pixel SPX, and a second pixel power line PL2 (also referred to as a "second power line") for transmitting a voltage of a second pixel power source VSS to the sub-pixel SPX. The gate line GL connected to each sub-pixel SPX (or the sub-pixels SPX of the pixels PXL disposed on any one horizontal line) may include a scan line SL, and may selectively further include a control line SSL. The sub-pixel SPX may be selectively further connected to at least another power line and/or signal line. For example, the sub-pixel SPX may be further connected to a sensing line SENL.

The display area DA may include the pixels PXL disposed on horizontal lines and vertical lines, and sub-pixels SPX forming the pixels PXL. At least one gate line GL may be disposed on and/or around each horizontal line (for example, each pixel row) of the display area DA, and at least one data line DL and/or sensing line SENL may be disposed on and/or around each vertical line (for example, each pixel column) of the display area DA. Accordingly, the display area DA may include gate lines GL, data lines DL, and/or sensing lines SENL.

The sub-pixel SPX may include the light emitting unit EMU for generating light of a luminance corresponding to each data signal. The sub-pixel SPX may further include a pixel circuit PXC for driving the light emitting unit EMU.

The pixel circuit PXC may be connected to the scan line SL and the data line DL, and may be connected between the first pixel power line PL1 and the light emitting unit EMU. For example, the pixel circuit PXC may be connected to the scan line SL to which the scan signal is supplied, the data line DL to which the data signal is supplied, the first pixel power line PL1 to which the voltage of the first pixel power source VDD is supplied, and the light emitting unit EMU.

The pixel circuit PXC may be selectively further connected to the control line SSL to which a control signal is supplied, and the sensing line SENL connected to reference power (or initialization power) or a sensing circuit in response to a display period or a sensing period. In an embodiment, the control signal may be the same as or different from the scan signal. In case that the control signal is the same as the scan signal, the control line SSL may be integrated with the scan line SL.

The pixel circuit PXC may include at least one transistor M and the capacitor Cst. For example, the pixel circuit PXC may include a first transistor M1, a second transistor M2, a third transistor M3, and the capacitor Cst.

The first transistor M1 may be connected between the first pixel power line PL1 and a second node N2. The second node N2 may be a node to which the pixel circuit PXC and the light emitting unit EMU are connected. A gate electrode of the first transistor M1 may be connected to a first node N1. The first transistor M1 may control a driving current supplied to the light emitting unit EMU in response to a voltage of the first node N1.

In an embodiment, the first transistor M1 may include a bottom metal layer (BML) (or a back gate electrode). In an embodiment, the bottom metal layer BML may be connected to one electrode (for example, a source electrode) of the first transistor M1.

In an embodiment in which the first transistor M1 may include the bottom metal layer BML, a back-biasing technique (or a sync technique) that moves a threshold voltage of the first transistor M1 in a negative direction or a positive direction by applying a back-biasing voltage to the bottom metal layer BML of the first transistor M1 may be applied. In in case that the bottom metal layer BML is disposed under or below a semiconductor pattern forming a channel of the first transistor M1, light incident on the semiconductor pattern may be blocked to stabilize an operation characteristic of the first transistor M1.

The second transistor M2 may be connected between the data line DL and the first node N1. A gate electrode of the second transistor M2 may be connected to the scan line SL. The second transistor M2 may be turned on in case that a scan signal of a gate-on voltage (for example, a high level voltage) is supplied from the scan line SL, to connect the data line DL and the first node N1.

In each frame period, a data signal of a corresponding frame may be supplied to the data line DL. The data signal may be transmitted to the first node through the second transistor M2 during a period in which the scan signal of the gate-on voltage is supplied.

One electrode of the capacitor Cst may be connected to the first node N1, and another electrode of the capacitor Cst may be connected to the second node N2. The capacitor Cst may charge a voltage corresponding to the data signal supplied to the first node N1 during each frame period.

The third transistor M3 may be connected between the second node N2 and the sensing line SENL. A gate electrode of the third transistor M3 may be connected to the control line SSL (or the scan line SL). The third transistor M3 may be turned on in case that a control signal (or a scan signal) of a gate-on voltage (for example, a high level voltage) is supplied from the control line SSL, to transmit the reference voltage (or the initialization voltage) supplied to the sensing line SENL to the second node N2 or transmit a voltage of the second node N2 to the sensing line SENL. The voltage of the second node N2 transmitted to the sensing circuit through the sensing line SENL may be provided to the driving circuit (for example, the timing controller TCON) to be used in compensation or the like of a characteristic deviation of the pixels PXL (or the sub-pixels SPX).

In FIGS. 6 and 7, all of the transistors M included in the pixel circuit PXC are N-type transistors, but the disclosure is not limited thereto. For example, at least one of the first, second, and third transistors M1, M2, and M3 may be a P-type transistor. The structure and driving method of the sub-pixel SPX may be variously changed according to an embodiment.

The light emitting unit EMU may include at least one light emitting element LD connected between the first pixel power source VDD and the second pixel power source VSS. For example, the light emitting unit EMU may include at least one light emitting element LD including a first end EP1 connected to the first pixel power source VDD through the pixel circuit PXC and the first pixel power line PL1 and a second end EP2 connected to the second pixel power source VSS through the second pixel power line PL2.

The first pixel power source VDD and the second pixel power source VSS may have different potentials. For example, the first pixel power source VDD may be a high potential pixel power source, and the second pixel power source VSS may be a low potential pixel power source. A potential difference between the first pixel power source VDD and the second pixel power source VSS may be equal to or greater than a threshold voltage of the light emitting elements LD.

In an embodiment, the first end EP1 may be a P-type end of the light emitting element LD, and the second end EP2 may be an N-type end of the light emitting element LD. For example, the light emitting element LD may be electrically connected between the first pixel power source VDD and the second pixel power source VSS in a forward direction. At least one light emitting element LD connected in the forward direction between the first pixel power source VDD and the second pixel power source VSS may form an effective light source of the sub-pixel SPX.

In an embodiment, as shown in FIG. 6, the light emitting unit EMU may include a single light emitting element LD connected in the forward direction between the first pixel power source VDD and the second pixel power source VSS. In an embodiment, the light emitting unit EMU may include light emitting elements LD connected in the forward direction between the first pixel power source VDD and the second pixel power source VSS. For example, as shown in FIG. 7, the light emitting unit EMU may include first light emitting elements LD1 each connected in the forward direction between the first pixel power source VDD and the second pixel power source VSS and connected in parallel with each other, and second light emitting elements LD2 each connected in the forward direction between the first light emitting elements LD1 and the second pixel power source VSS and connected in parallel with each other. The first ends EP1 of the first light emitting elements LD1 may be connected to the first pixel power source VDD through the pixel circuit PXC and the first pixel power line PL1, and the second ends EP2 of the first light emitting elements LD1 may be connected to the second pixel power source VSS through the second light emitting elements LD2 and the second pixel power line PL2. The first ends EP1 of the second light emitting elements LD2 may be connected to the first pixel power source VDD through the first light emitting elements LD1, the pixel circuit PXC, and the first pixel power line PL1, and the second ends EP2 of the second light emitting elements LD2 may be connected to the second pixel power source VSS through the second pixel power line PL2.

The configuration of the light emitting unit EMU may be changed. For example, the type, number, and/or line structure of the light emitting element(s) LD forming the light emitting unit EMU of the sub-pixel SPX may be variously changed according to an embodiment.

In an embodiment, each light emitting element LD may have a rod shape extending in one direction or a direction as in embodiments of FIGS. 1 and 2, and may be an inorganic light emitting element including a nitride-based semiconductor material. Each light emitting element LD may be an ultra-small light emitting element having a size of a range of nanometer to micrometer. However, the type, material, structure, size, shape, and/or the like of the light emitting element LD may be variously changed according to an embodiment.

FIGS. 8 to 11 are schematic plan views illustrating a disposition structure of a gate driver GDR according to an embodiment of the disclosure, respectively. For example, FIGS. 8 to 11 illustrate different embodiments in relation to a disposition of the stage circuits ST of a scan driver SDR included in the gate driver GDR. In an embodiment of FIGS. 8 to 11, the same reference numerals are given to configurations that may be similar or identical to each other, and a repetitive description is omitted.

Figure 8:
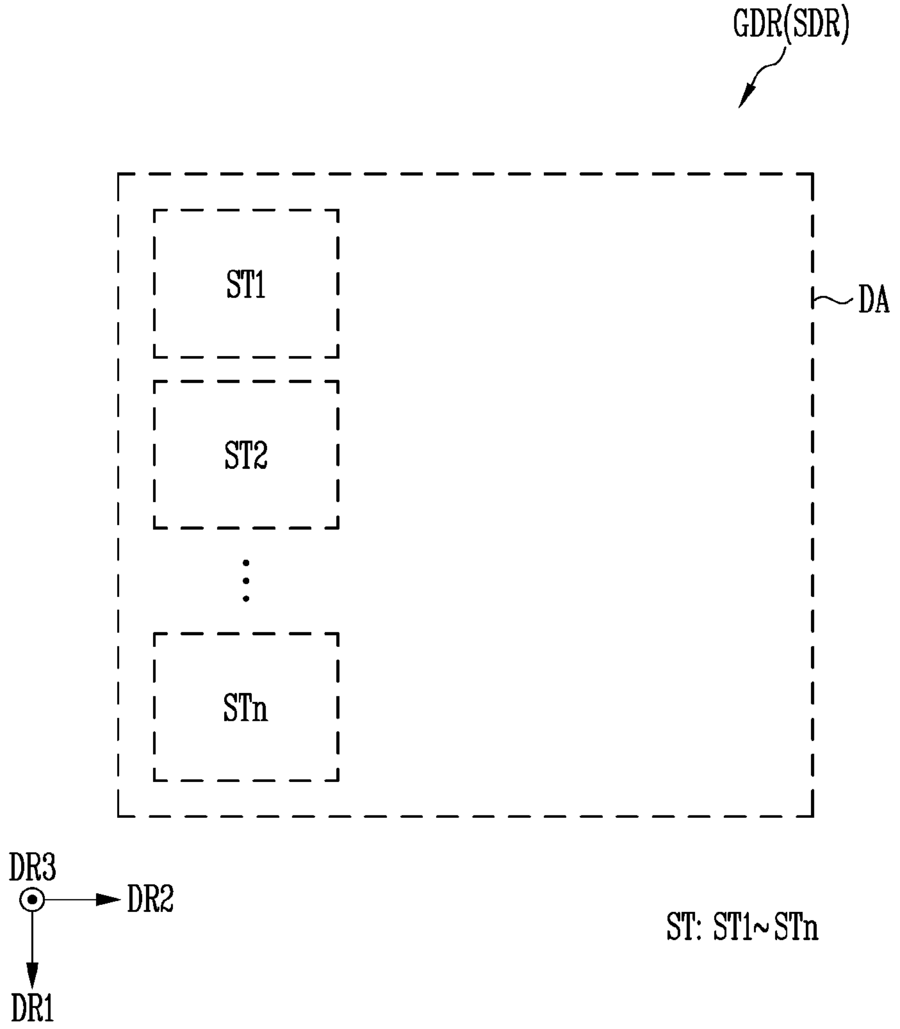
FIGS. 8 to 11 are schematic plan views illustrating a disposition structure of a gate driver according to an embodiment, respectively.
Figure 9:
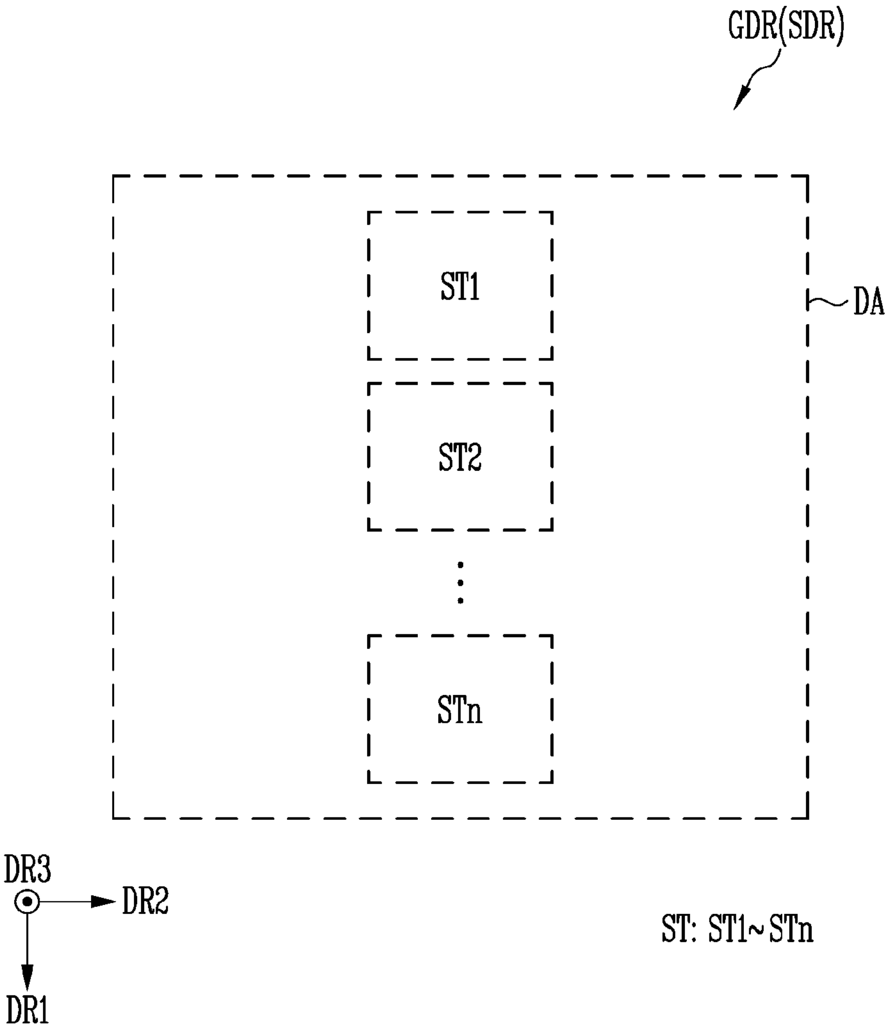

Referring to FIGS. 8 and 9, the scan driver SDR may include stage circuits ST. For example, the scan driver SDR may be disposed in the display area DA and include first to n-th (n is a natural number equal to or greater than 2) stage circuits ST1 to STn sequentially outputting the scan signals.

In an embodiment, the first to n-th stage circuits ST1 to STn may be sequentially disposed along the first direction DR1. In an embodiment, the first to n-th stage circuits ST1 to STn may be dependently connected to each other. For example, the first stage circuit ST1 may be connected to an input terminal of a start pulse, and the second stage circuit ST2 may be connected to an output terminal of the first stage circuit ST1.

In an embodiment, the first to n-th stage circuits ST1 to STn may be disposed close to any one edge area (for example, a left area or a right area) of the display area DA as in the embodiment of FIG. 8, or may be disposed in a central area of the display area DA as in the embodiment of FIG. 9. Positions of the first to n-th stage circuits ST1 to STn may be variously changed.

Each stage circuit ST may include driving elements (for example, the driving elements DRE of FIG. 3 or 4) disposed between the pixels PXL in a corresponding area.

Figure 10:
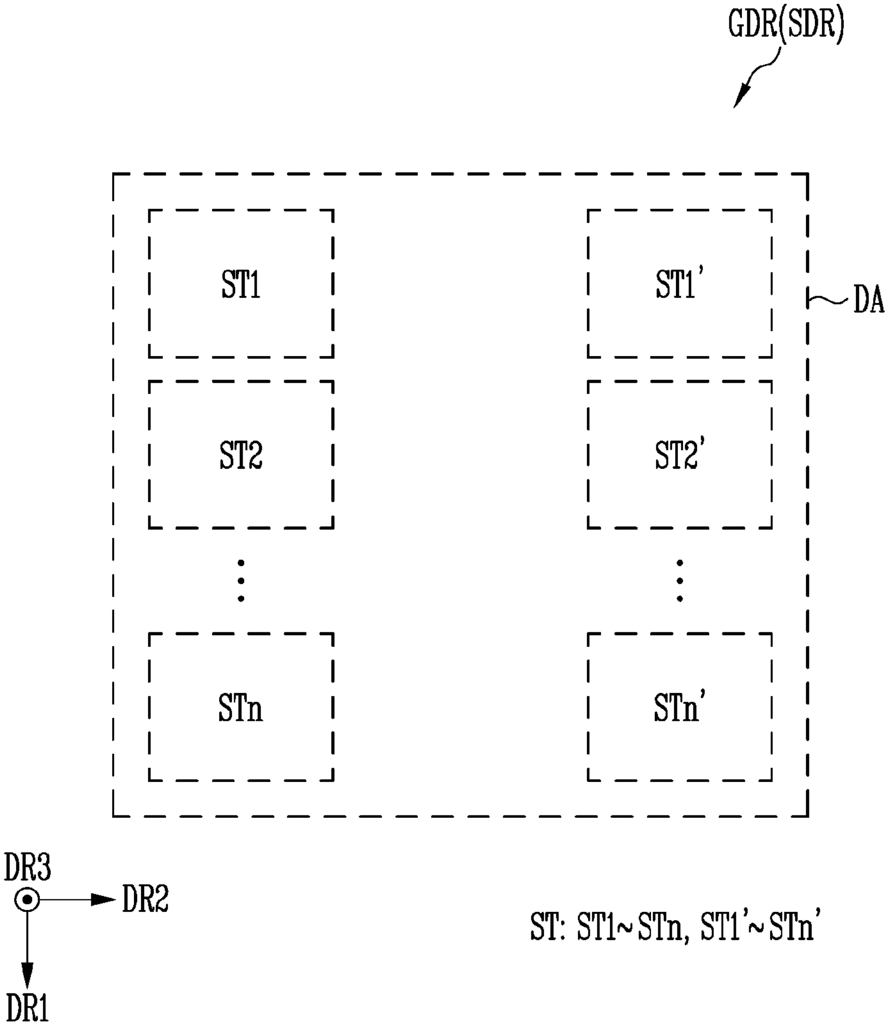

Referring to FIG. 10, the scan driver SDR may include the first to n-th stage circuits ST1 to STn disposed close to any one edge area (for example, a left area) of the display area DA and sequentially outputting the scan signals and first to n-th stage circuits ST1' to STn' disposed close to another edge area (for example, a right area) of the display area DA and sequentially outputting the scan signals. In an embodiment, the stage circuits (for example, the first to n-th stage circuits ST1 to STn on the left side and the first to n-th stage circuits ST1' to STn' of the right side) disposed in different edge areas of the display area DA may be driven simultaneously and/or independently of each other.

Figure 11:
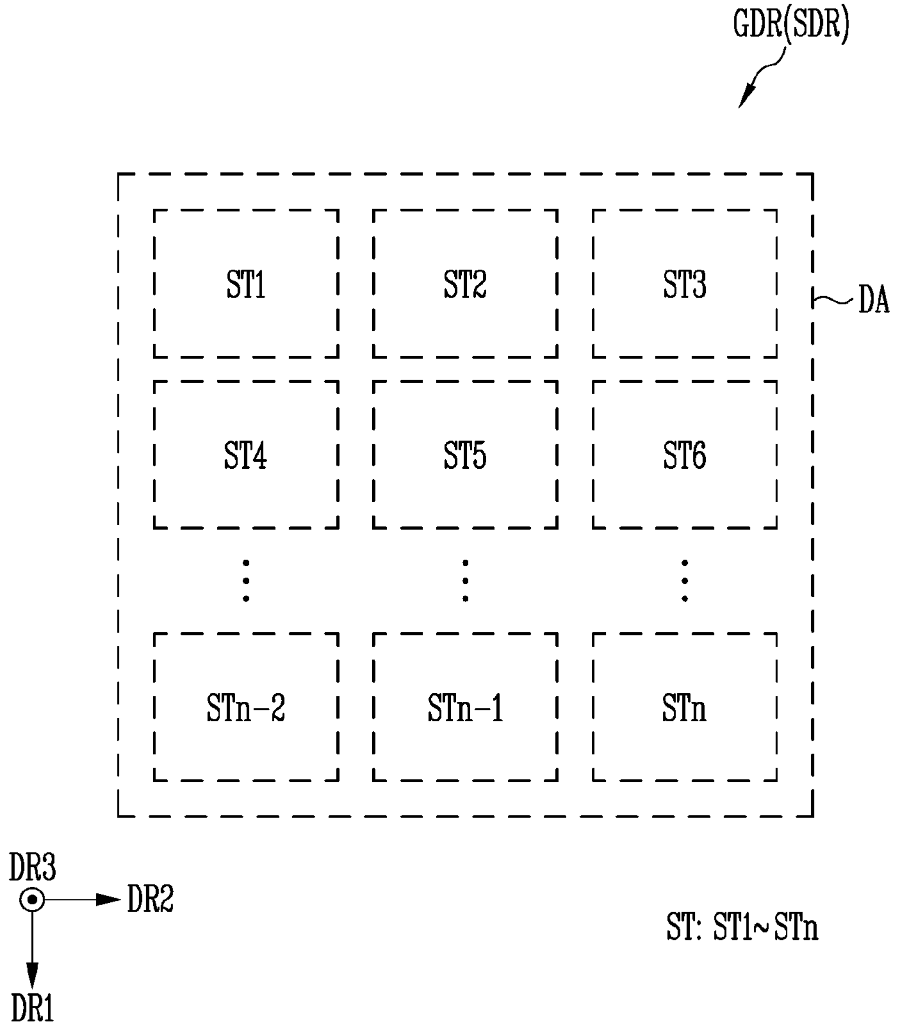

Referring to FIG. 11, the first to n-th stage circuits ST1 to STn may be disposed and/or arranged along the first direction DR1 and the second direction DR2 in the display area DA. In an embodiment, the first to n-th stage circuits ST1 to STn may be dependently connected to each other. In an embodiment, the first to n-th stage circuits ST1 to STn may be classified into stage groups, and the stage circuits ST of each stage group may be dependently connected to each other. For example, the stage circuits ST sequentially disposed along the first direction DR1 may form each stage group. The stage groups may receive the driving signals independently and/or individually from each other, or may receive the driving signals simultaneously with each other.

The disposition structure, number, and/or the like of the stage circuits ST may be variously changed. The stage circuits ST may be uniformly distributed in the display area DA or non-uniformly distributed in the display area DA. For example, the stage circuits ST may be disposed at a uniform distance and/or density in the display area DA, or may be disposed to be concentrated in only a portion of the display area DA.

Figure 12:
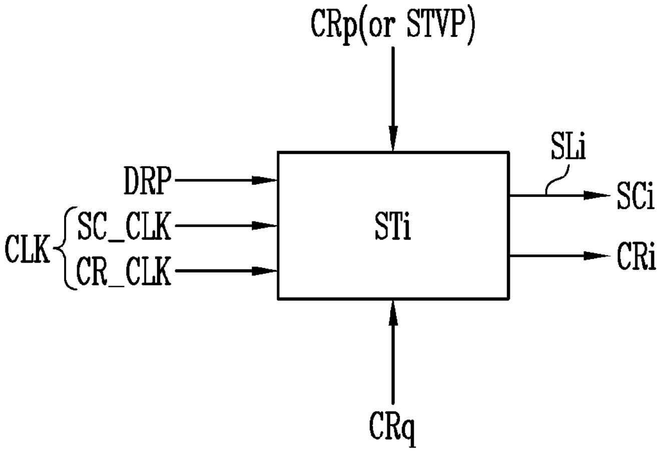
FIG. 12 is a block diagram illustrating an i-th stage circuit according to an embodiment.
Figure 13:
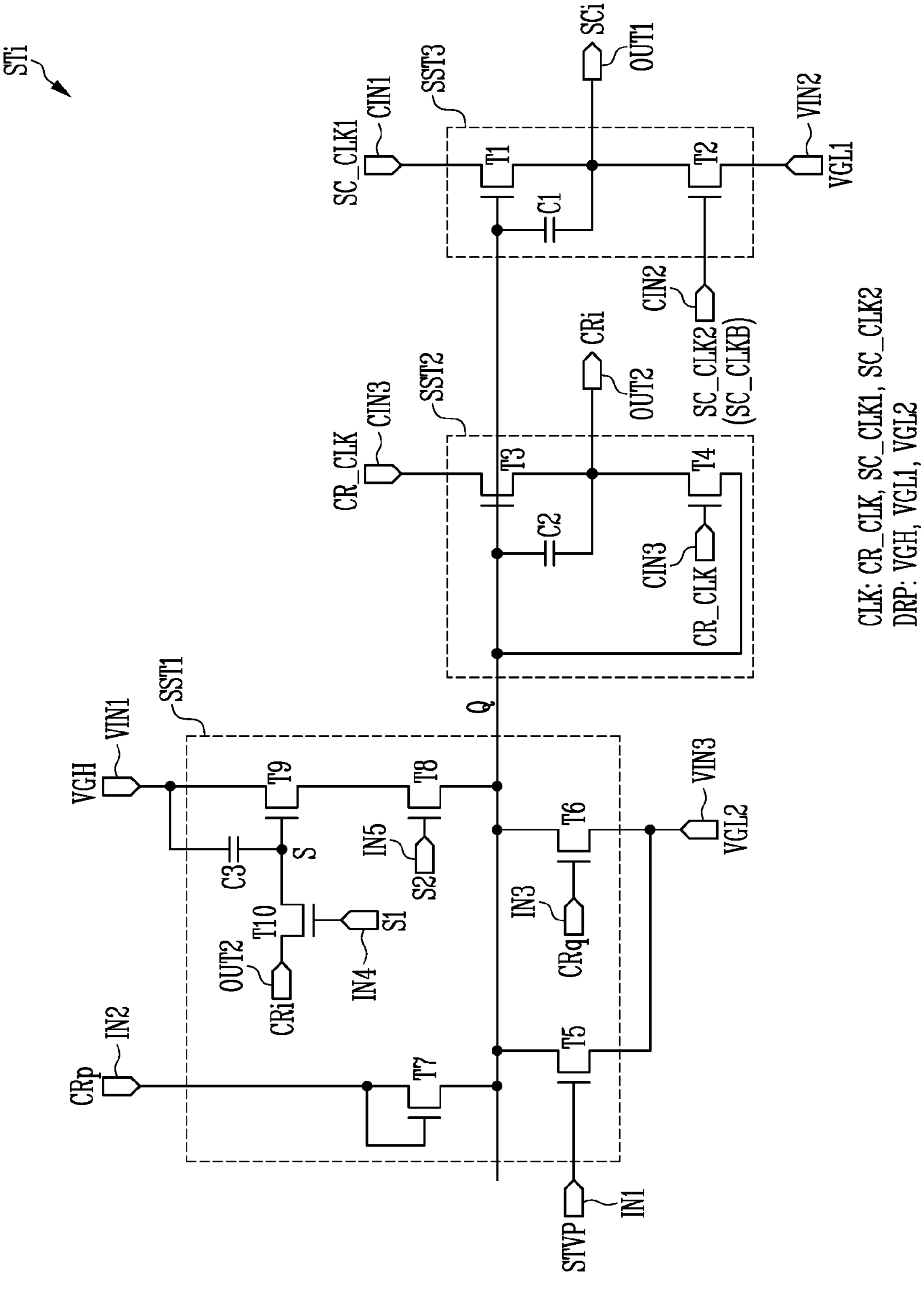
FIG. 13 is an equivalent circuit diagram illustrating an i-th stage circuit according to an embodiment.

FIG. 12 is a block diagram illustrating an i-th stage circuit STi according to an embodiment of the disclosure. FIG. 13 is an equivalent circuit diagram illustrating an i-th stage circuit STi according to an embodiment of the disclosure. In an embodiment, the i-th stage circuit STi may be any stage circuit included in the gate driver GDR (for example, the scan driver SDR). For example, the i-th stage circuit STi may be any one of the first to n-th stage circuits ST1 to STn of FIGS. 8 to 11.

Referring to FIG. 12, the i-th stage circuit STi may receive driving power DRP, clock signals CLK, a previous carry signal CRp (or a start pulse STVP in a case where the i-th stage circuit STi is a first stage circuit of the gate driver GDR and/or the shift register) output from a previous stage circuit (for example, an (i−1)-th (i is a natural number equal to or greater than 2) stage circuit or an (i−k)-th (i is a natural number equal to or greater than 2) stage circuit. In an embodiment, the clock signals CLK may include at least one scan clock signal SC_CLK and at least one carry clock signal CR_CLK.

In an embodiment, the i-th stage circuit STi may selectively further receive a next carry signal CRq output from a next stage circuit (for example, an (i+1)-th stage circuit or an (i+k)-th stage circuit). According to a circuit configuration of the i-th stage circuit STi, the type and/or number of the driving power DRP and the driving signals (for example, the clock signals CLK, the previous carry signal CRp, and/or the next carry signal CRq) input to the i-th stage circuit STi may be variously changed.

The i-th stage circuit STi may output an i-th scan signal SCi and an i-th carry signal CRi in response to the driving power DRP and the driving signals. The i-th scan signal SCi may be supplied to the pixels PXL (for example, the pixels PXL disposed on the i-th horizontal line of the display area DA) of at least one horizontal line through an i-th scan line SLi, and may be used as the scan signal for supplying the data signal to the pixels PXL of the at least one horizontal line. The i-th carry signal CRi may be supplied to any one of the next stage circuits (for example, the (i+1)-th stage circuit or the (i+k)-th stage circuit), and may be used as the previous carry signal CRp of the next stage circuit. In an embodiment, the i-th carry signal CRi may be supplied to any one previous stage circuit, and may be used as the next carry signal CRq of the previous stage circuit.

Referring to FIG. 13, the i-th stage circuit STi may include a node control circuit SST1, a first output circuit SST2, and a second output circuit SST3.

The node control circuit SST1 may control a node voltage of a first node Q (hereinafter, referred to as a "first node voltage") based on the previous carry signal CRp (or the start pulse STVP) and the clock signals CLK. For example, the node control circuit SST1 may maintain the first node voltage as a logic-low voltage (for example, a gate-off voltage or a low-level voltage) in case that the previous carry signal CRp has a logic-low voltage. In case that the previous carry signal CRp has a logic-high voltage (for example, a gate-on voltage or a high-level voltage), the node control circuit SST1 may control the first node voltage so that the first node voltage becomes a logic-high voltage.

In an embodiment, the node control circuit SST1 may initialize the first node voltage based on the next carry signal CRq. The node control circuit SST1 may initialize the first node voltage using the next carry signal CRq so that the i-th stage circuit STi outputs an i-th carry signal CRi and an i-th scan signal SCi each having a logic-high voltage in a corresponding horizontal period, and the i-th stage circuit STi does not output the carry signal and the scan signal having a logic-high voltage after the corresponding horizontal period (for example, so that voltages of the i-th carry signal CRi and the i-th scan signal SCi become a logic-low voltage). In an embodiment, the node control circuit SST1 may initialize the first node voltage based on a separate reset signal or the like provided from an outside.

The node control circuit SST1 may include a fifth transistor T5, a sixth transistor T6, and a seventh transistor T7.

The fifth transistor T5 may include a first electrode connected to the first node Q, a second electrode connected to a third power input terminal VIN3 to which a second low potential driving power VGL2 is input, and a gate electrode connected to a first input terminal IN1 to which the start pulse STVP is input. The fifth transistor T5 may be turned on in response to a start pulse STVP of a logic-high voltage, to transmit a voltage of the second low potential driving power VGL2 to the first node Q. Accordingly, the first node voltage may be initialized or reset to the voltage of the second low potential driving power VGL2. For example, the first node voltage may be initialized or reset using the start pulse STVP as an initialization signal (or a reset signal).

The sixth transistor T6 may include a first electrode connected to the first node Q, a second electrode connected to the third power input terminal VIN3 to which the second low potential driving power VGL2 is input, and a gate electrode connected to a third input terminal IN3 to which the next carry signal CRq is input. The sixth transistor T6 may be turned on in response to a next carry signal CRq of a logic-high voltage, to transmit a voltage of the second low potential driving power VGL2 to the first node Q. For example, by the next carry signal CRq, the first node voltage may be changed or reset from a logic-high voltage (for example, a high-level voltage) to a logic-low voltage (for example, a low-level voltage).

The seventh transistor T7 may include a first electrode and a gate electrode connected to a second input terminal IN2 to which the previous carry signal CRp is input, and a second electrode connected to the first node Q. The seventh transistor T7 may transmit the previous carry signal CRp to the first node Q in response to the previous carry signal CRp (for example, a previous carry signal CRp of a logic-high voltage). The first node voltage may be changed to or maintained as a logic-high voltage.

In an embodiment, the node control circuit SST1 may further include circuit elements for selectively driving only a specific or given stage circuit (or pixels PXL of a specific or given horizontal line connected to the specific or given stage circuit). For example, the node control circuit SST1 may further include an eighth transistor T8, a ninth transistor T9, a tenth transistor T10, and a third capacitor C3. The node control circuit SST1 may further control the first node voltage based on a first selection signal S1 and a second selection signal S2 input to a fourth input terminal IN4 and a fifth input terminal IN5, in relation to selection driving.

The eighth transistor T8 may include a first electrode connected to a second electrode of the ninth transistor T9, a second electrode connected to the first node Q, and a gate electrode connected to a fifth input terminal IN5 to which the second selection signal S2 is input.

The ninth transistor T9 may include a first electrode connected to a first power input terminal VIN1 to which a high potential driving power VGH is input, a second electrode connected to the first electrode of the eighth transistor T8, and a gate electrode connected to a second node S.

The tenth transistor T10 may include a first electrode connected to a second output terminal OUT2 to which the i-th carry signal CRi is output, a second electrode connected to the second node S, and a gate electrode connected to the fourth input terminal IN4 to which the first selection signal S1 is input.

The third capacitor C3 may be connected between the first power input terminal VIN1 to which the high potential driving power VGH is input and the second node S.

In case that a first selection signal S1 of a logic-high voltage is applied to the fourth input terminal IN4, the i-th carry signal CRi may be transmitted to the second node S through the tenth transistor T10. For example, in case that the i-th stage circuit STi outputs the i-th carry signal CRi of the logic-high voltage, the i-th carry signal CRi of the logic-high voltage may be applied to the second node S. Accordingly, the third capacitor C3 may store the i-th carry signal CRi of the logic-high voltage, and the ninth transistor T9 may be turned on. Remaining stage circuits except for the i-th stage circuit STi may output a carry signal of a logic-low voltage, and thus the ninth transistors T9 of the remaining stage circuits may maintain a turn-off state. For example, only a stage outputting a carry signal may be selected while the first selection signal S1 of a logic-high voltage is applied.

Thereafter, in case that a second selection signal S2 of a logic-high voltage is applied to the fifth input terminal IN5, the eighth transistor T8 may be turned on. In case that the ninth transistor T9 is turned on, a voltage of the high potential driving power VGH may be applied to the first node Q through the eighth transistor T8 and the ninth transistor T9. The i-th stage circuit STi may output the i-th scan signal SCi to a first output terminal OUT1 in response to a node voltage of the first node Q. The ninth transistors T9 of remaining stage circuits except for a selected stage circuit may maintain a turn-off state. Accordingly, the remaining stage circuits may not output the scan signals.

The first output circuit SST2 may output the carry clock signal CR_CLK input to a third clock input terminal CIN3 in response to the first node voltage applied to the first node Q as the i-th carry signal CRi to the second output terminal OUT2. The first output circuit SST2 may include a third transistor T3, a fourth transistor T4, and a second capacitor C2.

The third transistor T3 may include a first electrode connected to the third clock input terminal CIN3, a second electrode connected to the second output terminal OUT2, and a gate electrode connected to the first node Q. In case that the first node voltage is a logic-high voltage, the third transistor T3 may output the carry clock signal CR_CLK input to the third clock input terminal CIN3 as the i-th carry signal CRi to the second output terminal OUT2.

The fourth transistor T4 may include a first electrode connected to the second output terminal OUT2, a second electrode connected to the first node Q, and a gate electrode connected to the third clock input terminal CIN3. The fourth transistor T4 may be turned on in response to a carry clock signal CR_CLK of a logic-high voltage, to pull down or maintain a voltage of the i-th carry signal CRi using the first node voltage (or a low voltage that pulls down the first node voltage, for example, the voltage of the second low potential driving power VGL2).

The second capacitor C2 may be connected between the gate electrode of the third transistor T3 and the second output terminal OUT2. The second capacitor C2 may boost the i-th carry signal CRi of the logic-high voltage.

The second output circuit SST3 may output a first scan clock signal SC_CLK1 input to a first clock input terminal CIN1 in response to the first node voltage applied to the first node Q as the i-th scan signal SCi to the first output terminal OUT1 (or the i-th scan line SLi). The second output circuit SST3 may maintain or pull down a voltage of the first output terminal OUT1 to a voltage of a first low potential driving power VGL1 in response to a second scan clock signal SC_CLK2 input to a second clock input terminal CIN2. The second output circuit SST3 may include a first transistor T1, a second transistor T2, and a first capacitor C1.

The first transistor T1 may include a first electrode connected to the first clock input terminal CIN1, a second electrode connected to the first output terminal OUT1, and a gate electrode connected to the first node Q. In case that the first node voltage is a logic-high voltage, the first transistor T1 may output the first scan clock signal SC_CLK1 input to the first clock input terminal CIN1 as the i-th scan signal SCi to the first output terminal OUT1 (or the i-th scan line SLi).

The second transistor T2 may include a first electrode connected to the first output terminal OUT1, a second electrode connected to a second power input terminal VIN2 to which the first low potential driving power VGL1 is input, and a gate electrode connected to the second clock input terminal CIN2. The second transistor T2 may be turned on in response to a second scan clock signal SC_CLK2 of a logic-high voltage, to maintain or pull down the voltage of the first output terminal OUT1 to the voltage of the first low potential driving power VGL1. In an embodiment, the first scan clock signal SC_CLK1 and the second scan clock signal SC_CLK2 may have an opposite waveform (for example, a waveform having a phase difference of about 180 degrees). For example, the second scan clock signal SC_CLK2 may be an inverted signal SC_CLKB of the first scan clock signal SC_CLK1.

The first capacitor C1 may be connected between the gate electrode of the first transistor T1 and the first output terminal OUT1. The first capacitor C1 may boost the i-th carry signal CRi of the logic-high voltage.

In an embodiment, a waveform of the i-th scan signal SCi and a waveform of the i-th carry signal CRi may be different from each other. Accordingly, at least one scan clock signal SC_CLK (for example, the first scan clock signal SC_CLK1 and the second scan clock signal SC_CLK2) distinguished from the carry clock signal CR_CLK may be used, and the second output circuit SST3 distinguished from the first output circuit SST2 may be provided in the i-th stage circuit STi. In order to prevent an interference between an output signal (for example, the i-th carry signal CRi) of the first output circuit SST2 and an output signal (for example, the i-th scan signal SCi) of the second output circuit SST3, low potential driving power (for example, the first low potential driving power VGL1 and the second low potential driving power VGL2) distinguished from each other may be used.

In addition to an embodiment of FIGS. 12 and 13, the configuration and the operation according to the configuration of the i-th stage circuit STi may be variously changed. Input power and input signals input to the i-th stage circuit STi may be variously changed according to the configuration of the i-th stage circuit STi.

Figure 14:
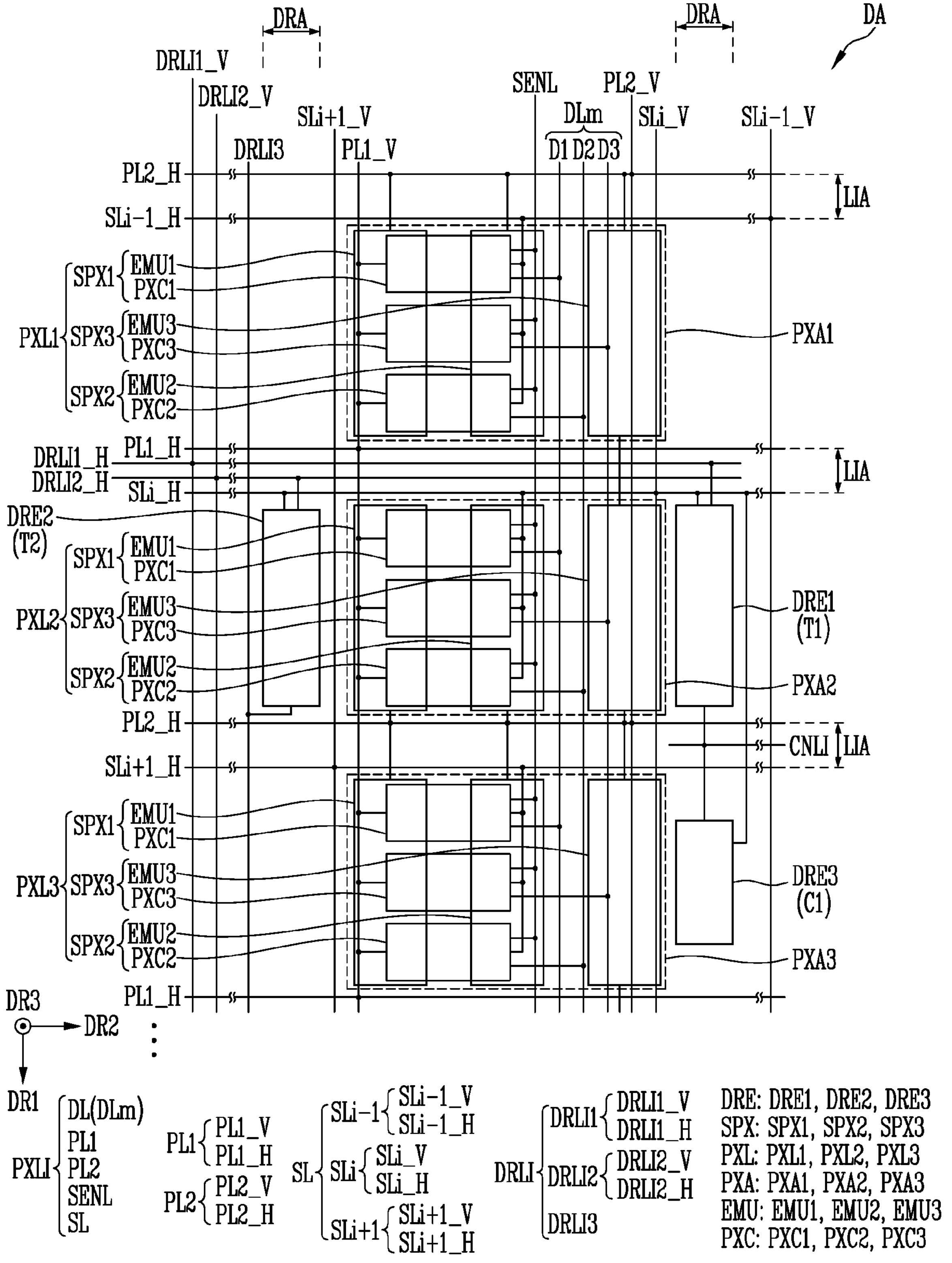
FIG. 14 is a schematic plan view illustrating a display area of a display device according to an embodiment.

FIG. 14 is a schematic plan view illustrating a display area DA of a display device DD according to an embodiment of the disclosure. In FIG. 14, a structure of the display area DA is schematically shown based on a first pixel PXL1, a second pixel PXL2, and a third pixel PXL3 sequentially arranged (or disposed) in the display area DA along the first direction DR1. For example, the first pixel PXL1 and the second pixel PXL2 may be adjacent to each other in the first direction DR1, and the second pixel PXL2 and the third pixel PXL3 may be adjacent to each other in the first direction DR1.

Referring to FIGS. 3 to 14, the display area DA may include pixels PXL including the first pixel PXL1, the second pixel PXL2, and the third pixel PXL3. The display area DA may include pixel lines PXL1 connected to the pixels PXL.

Each pixel PXL may include at least two sub-pixels SPX disposed in each pixel area PXA. For example, the first pixel PXL1 may include a first sub-pixel SPX1, a second sub-pixel SPX2, and a third sub-pixel SPX3 disposed in a first pixel area PXA1. The second pixel PXL2 may include a first sub-pixel SPX1, a second sub-pixel SPX2, and a third sub-pixel SPX3 disposed in a second pixel area PXA2. The third pixel PXL3 may include a first sub-pixel SPX1, a second sub-pixel SPX2, and a third sub-pixel SPX3 disposed in a third pixel area PXA3.

In an embodiment, the first pixel PXL1 may be disposed on an (i−1)-th horizontal line (for example, an (i−1)-th pixel row) and an m-th (m is a natural number) vertical line (for example, an m-th pixel column) of the display area DA, and the second pixel PXL2 may be disposed on an i-th horizontal line (for example, an i-th pixel row) and the m-th vertical line of the display area DA. The third pixel PXL3 may be disposed on an (i+1)-th horizontal line (for example, an (i+1)-th pixel row) and the m-th vertical line of the display area DA. For example, the first pixel PXL1, the second pixel PXL2, and the third pixel PXL3 may be sequentially disposed along the first direction DR1 on the m-th vertical line of the display area DA.

Each sub-pixel SPX may include a pixel circuit PXC and a light emitting unit EMU. For example, each first sub-pixel SPX1 may include a first pixel circuit PXC1 and a first light emitting unit EMU 1 electrically connected to the first pixel circuit PXC1. Each second sub-pixel SPX2 may include a second pixel circuit PXC2 and a second light emitting unit EMU2 electrically connected to the second pixel circuit PXC2. Each third sub-pixel SPX3 may include a third pixel circuit PXC3 and a third light emitting unit EMU3 electrically connected to the third pixel circuit PXC3.

In an embodiment, the light emitting units EMU disposed in each pixel area PXA may overlap at least one pixel circuit PXC and/or at least one pixel line PXL1. In an embodiment, the light emitting units EMU and the pixel circuits PXC disposed in each pixel area PXA may be arranged (or disposed) in different directions. For example, the pixel circuits PXC of each pixel PXL may be arranged (or disposed) along the first direction DR1 in the corresponding pixel area PXA, and the light emitting units EMU of each pixel PXL may be arranged (or disposed) along the second direction DR2 in the corresponding pixel area PXA. The disposition order, direction, and/or the like of the pixel circuits PXC and the light emitting units EMU may not be particularly limited, and may be variously changed according to an embodiment. For example, the disposition order and/or direction of the pixel circuits PXC and the light emitting units EMU may be determined to efficiently utilize the limited pixel area PXA.

Each pixel circuit PXC may be electrically connected to the scan line SL of a corresponding horizontal line, the data line DL (for example, any one of first to third sub data lines D1 to D3 forming an m-th data line DLm) and the sensing line SENL of a corresponding vertical line, the first pixel power line PL1, and the light emitting unit EMU of the corresponding sub-pixel SPX.

For example, the first pixel circuit PXC1 of the first pixel PXL1 may be electrically connected to an (i−1)-th scan line SLi−1, the first sub data line D1 and the sensing line SENL of the corresponding vertical line, the first pixel power line PL1, and a first light emitting unit EMU1 of the first pixel PXL1. The second pixel circuit PXC2 of the first pixel PXL1 may be electrically connected to the (i−1)-th scan line SLi−1, the second sub data line D2 and the sensing line SENL of the corresponding vertical line, and the first pixel power PL1, and the second light emitting unit EMU2 of the first pixel PXL1. The third pixel circuit PXC3 of the first pixel PXL1 may be electrically connected to the (i−1)-th scan line SLi−1, the third sub data line D3 and the sensing line SENL of the corresponding vertical line, and the first pixel power PL1, and the third light emitting unit EMU3 of the first pixel PXL1.

The first pixel circuit PXC1 of the second pixel PXL2 may be electrically connected to the i-th scan line SLi, the first sub data line D1 and the sensing line SENL of the corresponding vertical line, the first pixel power line PL1, and the first light emitting unit EMU1 of the second pixel PXL2. The second pixel circuit PXC2 of the second pixel PXL2 may be electrically connected to the i-th scan line SLi, the second sub data line D2 and the sensing line SENL of the corresponding vertical line, and the first pixel power line PL1, and the second light emitting unit EMU2 of the second pixel PXL2. The third pixel circuit PXC3 of the second pixel PXL2 may be electrically connected to the i-th scan line SLi, the third sub data line D3 and the sensing line SENL of the corresponding vertical line, and the first pixel power line PL1, and the third light emitting unit EMU3 of the second pixel PXL2.

The first pixel circuit PXC1 of the third pixel PXL3 may be electrically connected to an (i+1)-th scan line SLi+1, the first sub data line D1 and the sensing line SENL of the corresponding vertical line, and the first pixel power line PL1, and the first light emitting unit EMU1 of the third pixel PXL3. The second pixel circuit PXC2 of the third pixel PXL3 may be electrically connected to the (i+1)-th scan line SLi+1, the second sub data line D2 and the sensing line SENL of the corresponding vertical line, the first pixel power line PL1, and the second light emitting unit EMU2 of the third pixel PXL3. The third pixel circuit PXC3 of the third pixel PXL3 may be electrically connected to the (i+1)-th scan line SLi+1, the third sub data line D3 and the sensing line SENL of the corresponding vertical line, the first pixel power line PL1, and the third light emitting unit EMU3 of the third pixel PXL3.

Each light emitting unit EMU may be electrically connected to the pixel circuit PXC of the corresponding sub-pixel SPX and the second pixel power line PL2.

For example, the first light emitting unit EMU1 of the first pixel PXL1 may be electrically connected to the first pixel circuit PXC1 of the first pixel PXL1 and the second pixel power line PL2. The second light emitting unit EMU2 of the first pixel PXL1 may be electrically connected to the second pixel circuit PXC2 of the first pixel PXL1 and the second pixel power line PL2. The third light emitting unit EMU3 of the first pixel PXL1 may be electrically connected to the third pixel circuit PXC3 of the first pixel PXL1 and the second pixel power line PL2.

The first light emitting unit EMU1 of the second pixel PXL2 may be electrically connected to the first pixel circuit PXC1 of the second pixel PXL2 and the second pixel power line PL2. The second light emitting unit EMU2 of the second pixel PXL2 may be electrically connected to the second pixel circuit PXC2 of the second pixel PXL2 and the second pixel power line PL2. The third light emitting unit EMU3 of the second pixel PXL2 may be electrically connected to the third pixel circuit PXC3 of the second pixel PXL2 and the second pixel power line PL2.

The first light emitting unit EMU1 of the third pixel PXL3 may be electrically connected to the first pixel circuit PXC1 of the third pixel PXL3 and the second pixel power line PL2. The second light emitting unit EMU2 of the third pixel PXL3 may be electrically connected to the second pixel circuit PXC2 of the third pixel PXL3 and the second pixel power line PL2. The third light emitting unit EMU3 of the third pixel PXL3 may be electrically connected to the third pixel circuit PXC3 of the third pixel PXL3 and the second pixel power line PL2.

The pixel lines PXL1 may include the gate lines GL including the scan lines SL connected to the pixels PXL disposed on at least one horizontal line, respectively, the data lines DL and the sensing lines SENL connected to the pixels PXL disposed on at least one vertical line, respectively, and the first pixel power line PL1 and the second pixel power line PL2 commonly connected to the pixels PXL of the display area DA.

In an embodiment, the scan line SL of each horizontal line may be integrated with the control line SSL of the corresponding horizontal line. In an embodiment, the gate lines GL may further include the control lines SSL distinguished from the scan lines SL.

In an embodiment, at least some or a number of the pixel lines PXL1 may be formed as a mesh shape line including sub-lines extending in the first direction DR1 and the second direction DR2 in the display area DA, respectively, and electrically connected to each other. For example, the scan lines SL, the first pixel power line PL1, and the second pixel power line PL2 may be formed as a mesh shape lines including respective sub-lines.

For example, the (i−1)-th scan line SLi−1 may include a first sub-line SLi−1_V extending in the first direction DR1 and a second sub-line SLi−1_H extending in the second direction DR2. The first and second sub-lines SLi−1_V and SLi−1_H of the (i−1)-th scan line SLi−1 may be electrically connected to each other.

The i-th scan line SLi may include a first sub-line SLi_V extending in the first direction DR1 and a second sub-line SLi_H extending in the second direction DR2. The first and second sub-lines SLi_V and SLi_H of the i-th scan line SLi may be electrically connected to each other.

The (i+1)-th scan line SLi+1 may include a first sub-line SLi+1_V extending in the first direction DR1 and a second sub-line SLi+1_H extending in the second direction DR2. The first and second sub-lines SLi+1_V and SLi+1_H of the (i+1)-th scan line SLi+1 may be electrically connected to each other.

In case that the scan lines SL are formed in the first direction DR1 and the second direction DR2, positions of the pads and/or the driving circuit (for example, the scan driver SDR) may be freely changed. For example, even in a case where the display device DD is a short-side driving type display device, each scan signal may be supplied to the pixels PXL in a horizontal line unit.

The first pixel power line PL1 may include at least one first sub-line PL1_V extending in the first direction DR1 and at least one second sub-line PL1_H extending in the second direction DR2. The first and second sub-lines PL1_V and PL1_H of the first pixel power line PL1 may be electrically connected to each other.

The second pixel power line PL2 may include at least one first sub-line PL2_V extending in the first direction DR1 and at least one second sub-line PL2_H extending in the second direction DR2. The first and second sub-lines PL2_V and PL2_H of the second pixel power line PL2 may be electrically connected to each other.

In case that the first pixel power line PL1 and the second pixel power line PL2 are formed in the first direction DR1 and the second direction DR2, a voltage drop (an IR drop) of the voltages of the first pixel power source VDD and the second pixel power source VSS may be prevented or minimized. Accordingly, the voltages of the first pixel power source VDD and the second pixel power source VSS of a uniform level may be transmitted to the pixels PXL.

The display area DA may include the driving elements DRE disposed in an area (also referred to as a "driving circuit area DRA") between the pixels PXL. For example, the display area DA may include first, second, and third driving elements DRE1, DRE2, and DRE3 disposed around the first pixel PXL1, the second pixel PXL2, and/or the third pixel PXL3. The display area DA may include driving lines DRLI connected to the driving elements DRE.

In an embodiment, the scan driver SDR including the stage circuits ST connected to the scan lines SL may be disposed in the display area DA. For example, the driving elements DRE (for example, transistors and capacitors forming the stages ST) forming the stage circuits ST of the scan driver SDR may be distributed between the pixels PXL. The driving lines DRLI may include input signal lines and power lines of the scan driver SDR. For example, the driving lines DRLI may include the input signals of the scan driver SDR for transmitting the clock signals CLK, the start pulse STVP, the previous carry signal CRp, and/or the next carry signal CRq to each stage circuit ST of the scan driver SDR, and the power lines for supplying the driving power DRP to each stage circuit ST of the scan driver SDR.

Each driving line DRLI may be disposed at least one area of an area between at least two pixels PXL adjacent to each other in the first direction DR1 and an area between at least two pixels PXL adjacent to each other in the second direction DR2. For example, at least some or a number of the driving lines DRLI may be formed as a mesh shape lines including sub-lines extending in the first direction DR1 and the second direction DR2, respectively, and pass through the area between the pixels PXL, and may be electrically connected to at least one driving element DRE. Each of remaining driving lines DRLI may extend in the first direction DR1 and may be electrically connected to at least one driving element DRE.

In an embodiment, each of the first, second, and third driving elements DRE1, DRE2, and DRE3 may be any one circuit element (for example, a transistor or a capacitor) included in any one stage circuit ST (for example, the i-th stage circuit STi). For example, the first, second, and third driving elements DRE1, DRE2, and DRE3 may be the first transistor T1, the second transistor T2, and the first capacitor C1 of the i-th stage circuit STi, respectively.

The driving lines DRLI connected to the first, second, and third driving elements DRE1, DRE2, and DRE3, and/or at least one connection line CNLI may be disposed around the first, second, and third driving elements DRE1, DRE2, and DRE3. For example, a first driving line DRLI1 electrically connected to the first driving element DRE1, a second driving line DRLI2 and a third driving line DRLI3 electrically connected to the second driving element DRE2, and the connection line CNLI electrically connected to the third driving element DRE3 may be disposed around the first, second, and third driving elements DRE1, DRE2, and DRE3.

In an embodiment, in case that the first driving element DRE1 is the first transistor T1 of the i-th stage circuit STi, the first driving line DRLI1 may be a first clock line for transmitting the first scan clock signal SC_CLK1 to the first driving element DRE1. The first driving element DRE1 may be connected to the first node Q through the connection line CNLI to be turned on in response to the first node voltage, and may be connected to the i-th scan line SLi to output the i-th scan signal SCi through the i-th scan line SLi.

In an embodiment, in case that the second driving element DRE2 is the second transistor T2 of the i-th stage circuit STi, the second driving line DRLI2 may be a second clock line for transmitting the second scan clock signal SC_CLK2 to the second driving element DRE2, and the third driving line DRLI3 may be a driving power line for transmitting the voltage of the first low potential driving power VGL1 to the second driving element DRE2. The second driving element DRE2 may be connected to the i-th scan line SLi to maintain or pull-down the voltage of the i-th scan line SLi to the voltage of the first low potential driving power VGL1.

In an embodiment, in case that the third driving element DRE3 is the first capacitor C1 of the i-th stage circuit STi, the third driving element DRE3 may be connected to the i-th scan line SLi and the connection line CNLI.

In an embodiment, at least some or a number of the driving lines DRLI (for example, at least a portion of the driving lines DRLI crossing or intersecting a line area LIA between the pixels PXL in the second direction DR2) may be formed as a mesh shape line including sub-lines extending in the first direction DR1 and the second direction DR2 in the display area DA, respectively, and electrically connected to each other. For example, the first driving line DRLI1 and the second driving line DRLI2 may be formed as mesh shape lines including respective sub-lines.

For example, the first driving line DRLI1 may include a first sub-line DRLI1_V extending in the first direction DR1 and a second sub-line DRLI1_H extending in the second direction DR2. The first and second sub-lines DRLI1_V and DRLI1_H of the first driving line DRLI1 may be electrically connected to each other. The second sub-line DRLI1_H of the first driving line DRLI1 may be disposed in a line area LIA between the first pixel PXL1 and the second pixel PXL2 (for example, the line area LIA positioned between the pixel row in which the first pixel PXL1 is disposed and the pixel row in which the second pixel PXL2 is disposed and extending in the second direction DR2), and may extend in the second direction DR2 in the line area LIA.

The second driving line DRLI2 may include a first sub-line DRLI2_V extending in the first direction DR1 and a second sub-line DRLI2_H extending in the second direction DR2. The first and second sub-lines DRLI2_V and DRLI2_H of the second driving line DRLI2 may be electrically connected to each other.

In an embodiment, the second sub-line DRLI2_H of the second driving line DRLI2 may be positioned around the second sub-line DRLI1_H of the first driving line DRLI1. For example, the second sub-line DRLI2_H of the second driving line DRLI2 may pass through the line area LIA between the first pixel PXL1 and the second pixel PXL2, and may extend in the second direction DR2 in the line area LIA, together with the second sub-line DRLI1_H of the first driving line DRLI1.

In an embodiment, the connection line CNLI may be a conductive pattern (or a bridge pattern) connected between at least two driving elements DRE. At least a portion of the connection line CNLI may pass through the line area LIA between at least two pixels PXL adjacent to each other in the first direction DR1, and may extend in the second direction DR2 in the line area LIA between the at least two pixels PXL.

The first electrodes (for example, first electrodes ELT1 of FIGS. 15 to 18) of the pixels PXL disposed around the connection line CNLI may not overlap the connection line CNLI. For example, the connection line CNLI may cross or intersect at least one disconnection area OPA in the second direction DR2 in the line area LIA positioned between at least two pixels PXL adjacent in the first direction DR1, and may not overlap the first electrodes of at least two pixels PXL adjacent in the first direction DR1.

Figure 15:
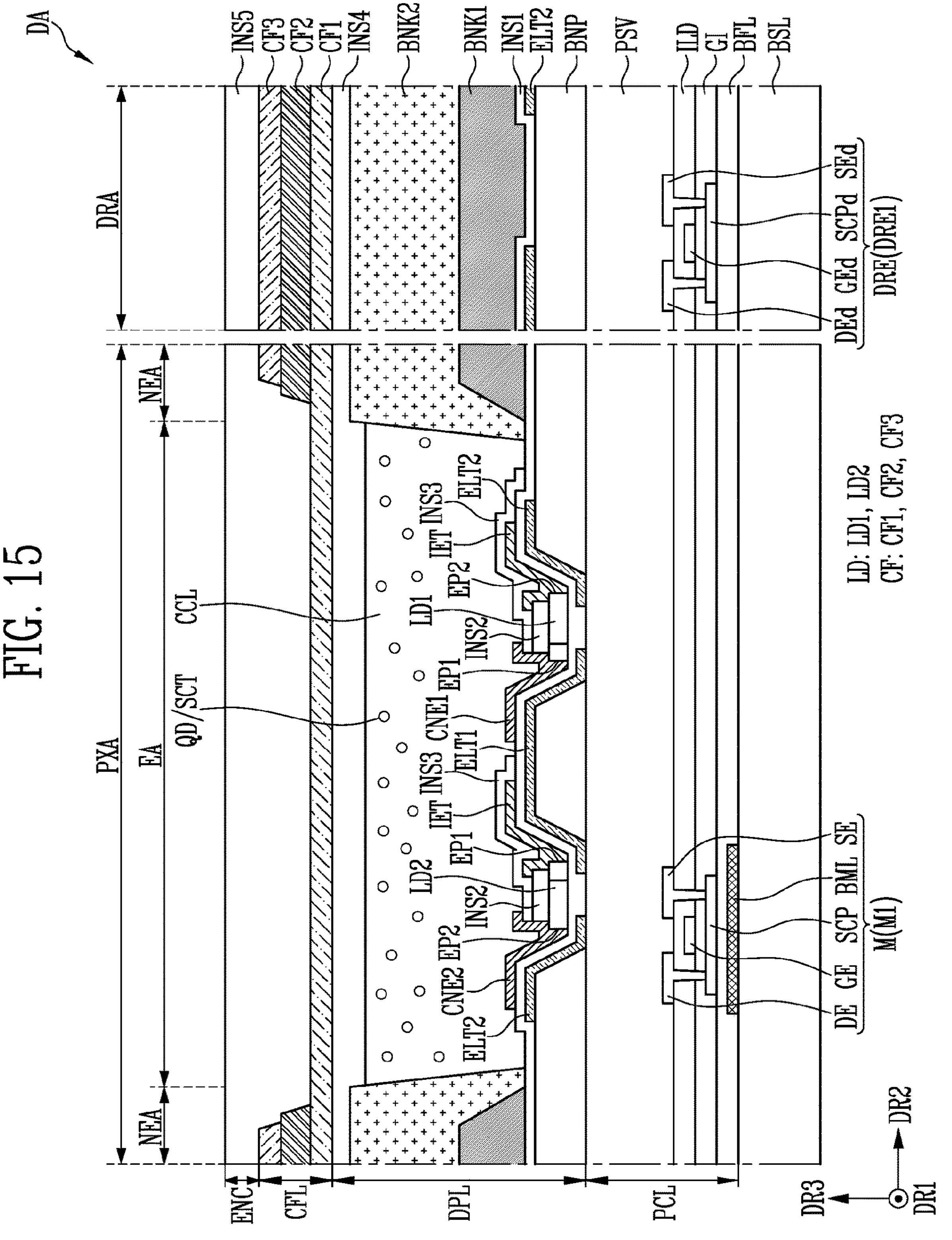
FIGS. 15 and 16 are schematic cross-sectional views illustrating a display area of a display device according to an embodiment, respectively.
Figure 16:
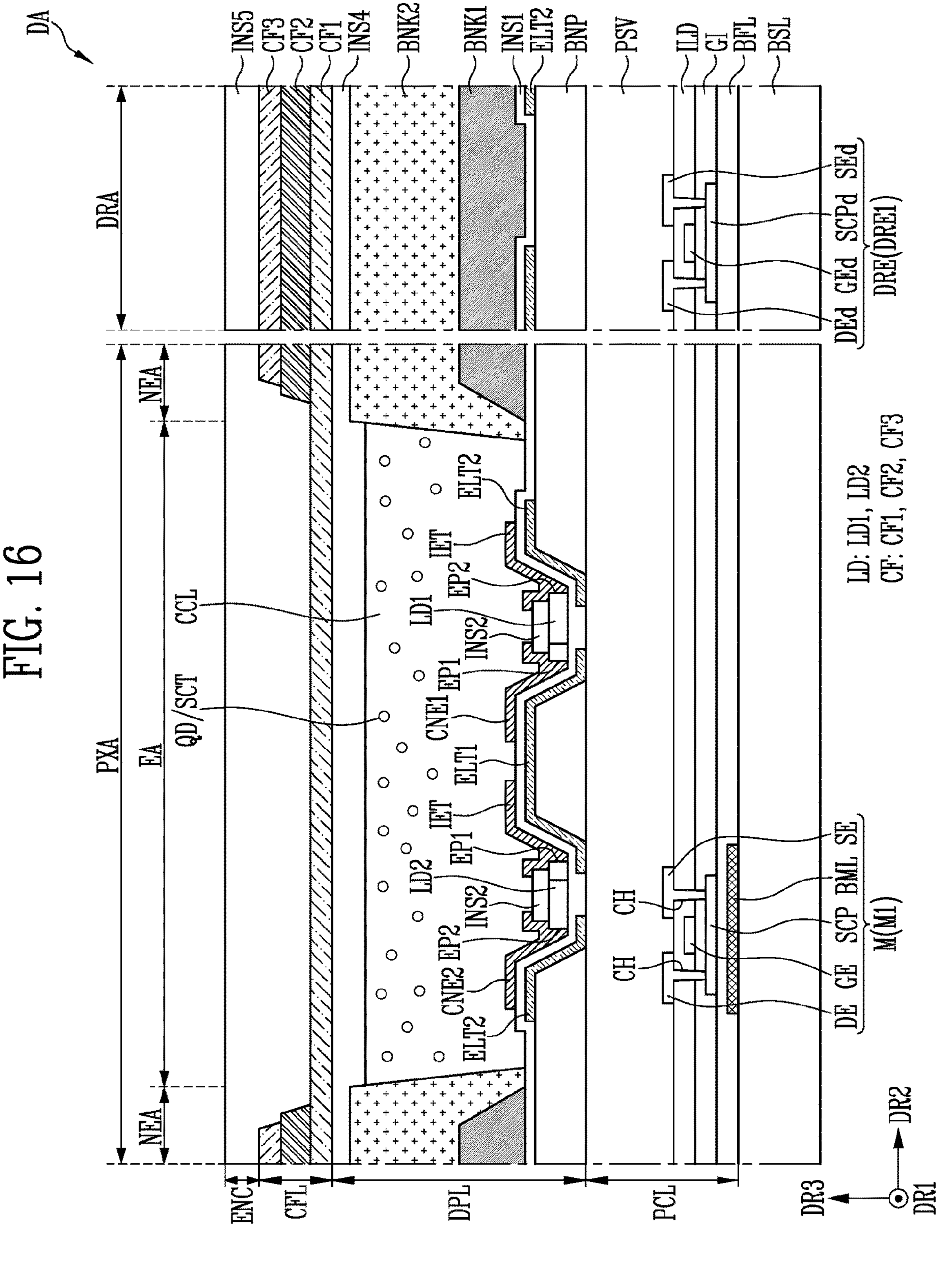

FIGS. 15 and 16 are schematic cross-sectional views illustrating a display area DA of a display device DD according to an embodiment, respectively. For example, FIGS. 15 and 16 schematically show a cross section of the display area DA based on any one sub-pixel SPX including the light emitting unit EMU having a series-parallel structure including at least one first light emitting element LD1 and at least one second light emitting element LD2 as in the embodiment of FIG. 7, and any one driving element DRE (for example, the first driving element DRE1) positioned around the sub-pixel SPX. FIGS. 15 and 16 illustrate different embodiments in relation to a mutual position of first and second contact electrodes CNE1 and CNE2 and an intermediate electrode IET.

In FIGS. 15 and 16, as an example of circuit elements that may be disposed in a pixel circuit layer PCL of the display area DA, a cross section of any one transistor M (for example, the first transistor M1 including the bottom metal layer BML) and any one driving element DRE (for example, the first driving element DRE1 forming the first transistor T1 of the i-th stage circuit STi) provided (or disposed) in each stage circuit ST is illustrated. Various lines may be further disposed in the pixel circuit layer PCL in addition to the circuit elements provided (or disposed) in each of the pixel circuit PXC and the stage circuit ST. In FIGS. 15 and 16, as an example of the light emitting unit EMU that may be disposed in the display layer DPL of the display area DA, as in the embodiment of FIG. 7, a cross section of the light emitting unit EMU including the first light emitting element LD1 and the second light emitting element LD2 is illustrated.

The sub-pixels SPX disposed in the display area DA may have substantially similar cross-sectional structures. However, the size, position, shape, and/or the like of the circuit elements forming the sub-pixels SPX and the electrodes included in the circuit elements may be different for each sub-pixel SPX.

Referring to FIGS. 1 to 16, the display device DD may include the display panel PNL including a base layer BSL, the pixel circuit layer PCL, and a display layer DPL. The pixel circuit layer PCL and the display layer DPL may be disposed to overlap each other on the base layer BSL. For example, the pixel circuit layer PCL and the display layer DPL may be sequentially disposed on one surface or a surface of the base layer BSL.

The display panel PNL may further include a color filter layer CFL and/or an encapsulation layer ENC (or a protective layer) disposed on the display layer DPL. In an embodiment, the color filter layer CFL and/or the encapsulation layer ENC may be formed on or directly formed on one surface or a surface of the base layer BSL on which the pixel circuit layer PCL and the display layer DPL are formed, but the disclosure is not limited.

The base layer BSL may be a rigid substrate or a flexible substrate or film, and a material or a structure thereof is not particularly limited. For example, the base layer BSL may include at least one transparent or opaque insulating material, and may be a substrate or a film of single layer or multiple layers.

The pixel circuit layer PCL may be provided (or disposed) on one surface or a surface of the base layer BSL. The pixel circuit layer PCL may include the circuit elements forming the pixel circuits PXC (for example, the first, second, and third pixel circuits PXC1, PXC2, and PXC3) of each pixel PXL, and the circuit elements (for example, the driving elements DRE forming the stage circuits ST of the scan driver SDR) forming the gate driver GDR. For example, in each pixel area PXA of the pixel circuit layer PCL, circuit elements including the first transistors M1 of the first, second, and third pixel circuits PXC1, PXC2, and PXC3 may be formed. In the driving circuit area DRA of the pixel circuit layer PCL (for example, an area between the pixel areas PXA adjacent to each other in the second direction DR2), driving elements DRE including the first transistors T1 of the stage circuits ST may be formed. The pixel circuit layer PCL may include the pixel lines PXL1 connected to the pixels PXL and the driving lines DRLI connected to the driving elements DRE.

Additionally, the pixel circuit layer PCL may include insulating layers. For example, the pixel circuit layer PCL may include a buffer layer BFL, a gate insulating layer GI, an interlayer insulating layer ILD, and/or a passivation layer PSV sequentially disposed on one surface or a surface of the base layer BSL.

The pixel circuit layer PCL may be disposed on the base layer BSL and may include a first conductive layer including the bottom metal layers BML of the first transistors M1. For example, the first conductive layer may be disposed between the base layer BSL and the buffer layer BFL, and may include the bottom metal layers BML of the first transistors M1 included in sub-pixels SPX. The bottom metal layers BML of the first transistors M1 may overlap gate electrodes GE and semiconductor patterns SCP of the first transistors M1. The first conductive layer may further include lines. For example, the first conductive layer may include at least some or a number of lines extending in the first direction DR1 in the display area DA.

The buffer layer BFL may be disposed on one surface or a surface of the base layer BSL including the first conductive layer. The buffer layer BFL may prevent an impurity from diffusing into each circuit element.

A semiconductor layer may be disposed on the buffer layer BFL. The semiconductor layer may include the semiconductor patterns SCP of the transistors M provided (or disposed) in the pixel circuits PXC. Each semiconductor pattern SCP may include a channel region overlapping the gate electrode GE of the corresponding transistor M, and first and second conductive regions (for example, source and drain regions) disposed on both sides of the channel region. Each semiconductor pattern SCP may be a semiconductor pattern formed of polysilicon, amorphous silicon, an oxide semiconductor, or the like within the spirit and the scope of the disclosure. In an embodiment, in case that the at least one driving element DRE is formed of a transistor, the semiconductor layer may include a semiconductor pattern SCPd of the at least one driving element DRE.

The gate insulating layer GI may be disposed on the semiconductor layer. A second conductive layer may be disposed on the gate insulating layer GI.

The second conductive layer may include the gate electrodes GE of the transistors M provided (or disposed) in the pixel circuits PXC. The second conductive layer may further include one electrode of each of the capacitors Cst, bridge patterns, and/or the like provided (or disposed) in the pixel circuits PXC. Additionally, in case that at least one power line and/or signal line disposed in the display area DA is formed of multiple layers, the second conductive layer may further include at least one conductive pattern forming the at least one power line and/or signal line. In an embodiment, in case that the at least one driving element DRE is formed of a transistor, the second conductive layer may include a gate electrode GEd of the at least one driving element DRE. In case that the at least one driving element DRE is formed of a capacitor, the second conductive layer may include one electrode of the at least one driving element DRE.

The interlayer insulating layer ILD may be disposed on the second conductive layer. A third conductive layer may be disposed on the interlayer insulating layer ILD.

The third conductive layer may include source electrodes SE and drain electrodes DE of the transistors M provided (or disposed) in the pixel circuits PXC. Each source electrode SE may be electrically connected to one region (for example, the source region) of the semiconductor pattern SCP included in the corresponding transistor M, and each drain electrode DE may be electrically connected to another region (for example, the drain region) of the semiconductor pattern SCP included in the corresponding transistor M. The third conductive layer may further include one electrode of each of the capacitors Cst, lines, and/or the bridge patterns provided (or disposed) in the pixel circuits PXC. For example, the third conductive layer may include at least some or a number of lines extending in the second direction DR2 in the display area DA. In an embodiment, in case that the at least one driving element DRE is formed of a transistor, the third conductive layer may include a source electrode SEd and a drain electrode DEd of the at least one driving element DRE. In case that the at least one driving element DRE is formed of a capacitor, the second conductive layer may include one electrode of the at least one driving element DRE.

Each conductive pattern, electrode and/or line forming the first to third conductive layers may have conductivity by including at least one conductive material, and a configuration material thereof is not particularly limited. For example, each conductive pattern, electrode and/or line forming the first to third conductive layers may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), and may include various types of conductive materials.

The passivation layer PSV may be disposed on the third conductive layer. Each of the buffer layer BFL, the gate insulating layer GI, the interlayer insulating layer ILD, and the passivation layer PSV may be formed of a single layer or multiple layers, and may include at least one inorganic insulating material and/or organic insulating material. For example, each of the buffer layer BFL, the gate insulating layer GI, the interlayer insulating layer ILD, and the passivation layer PSV may include various types of organic or inorganic insulating materials including silicon nitride (SiNx), silicon oxide (SiOx), silicon oxynitride (SiOxNy), and the like within the spirit and the scope of the disclosure. In an embodiment, the passivation layer PSV may include an organic insulating layer and may planarize a surface of the pixel circuit layer PCL.

The display layer DPL may be disposed on the passivation layer PSV.

The display layer DPL may include the light emitting units EMU of the sub-pixels SPX. For example, the display layer DPL may include first and second electrodes ELT1 and ELT2 disposed in an emission area EA of each sub-pixel SPX, at least one light emitting element LD, and the first and second contact electrodes CNE1 and CNE2. In an embodiment, each light emitting unit EMU may include light emitting elements LD including the first and second light emitting elements LD1 and LD2.

The display layer DPL may further include insulating patterns and/or insulating layers sequentially disposed on one surface or a surface of the base layer BSL on which the pixel circuit layer PCL is formed. For example, the display layer DPL may include bank patterns BNP, a first insulating layer INS1, a first bank BNK1, a second insulating layer INS2, a third insulating layer INS3, a second bank BNK2, and/or a fourth insulating layer INS4. The display layer DPL may selectively further include a light conversion layer CCL.

The bank patterns BNP (also referred to as "patterns" or "wall patterns") may be provided (or disposed) and/or formed on the passivation layer PSV. In an embodiment, the bank patterns BNP may be formed in separation type patterns individually disposed under or below the first and second electrodes ELT1 and ELT2 to overlap a portion of each of the first and second electrodes ELT1 and ELT2. For example, the bank patterns BNP may have an opening or a concave portion corresponding to areas between the first and second electrodes ELT1 and ELT2 in the emission areas EA of the sub-pixels SPX, and may be formed as an integral pattern entirely connected in the area DA.

The first and second electrodes ELT1 and ELT2 may protrude in an upper direction (for example, the third direction DR3) around the light emitting elements LD by the bank patterns BNP. The bank patterns BNP and the first and second electrodes ELT1 and ELT2 thereon may form a reflective protrusion pattern around the light emitting elements LD. Accordingly, light efficiency of the sub-pixels SPX may be improved.

The bank patterns BNP may include an inorganic insulating layer formed of an inorganic material or an organic insulating layer formed of an organic material. The bank patterns BNP may be formed of a single layer or multiple layers. The first and second electrodes ELT1 and ELT2 of the light emitting units EMU may be formed on the bank patterns BNP.

The first and second electrodes ELT1 and ELT2 may include at least one conductive material. For example, the first second electrodes ELT1 and ELT2 may include at least one conductive material among at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, an alloy thereof, a conductive oxide such as indium tin oxide (ITO), indium zinc oxide (IZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), and fluorine doped tin oxide (FTO), and a conductive polymer such as PEDOT, but are not limited thereto. For example, the first and second electrodes ELT1 and ELT2 may include other conductive materials such as a carbon nano tube or graphene. For example, the first and second electrodes ELT1 and ELT2 may have conductivity by including at least one of various conductive materials. The first and second electrodes ELT1 and ELT2 may include the same or different conductive materials.

In an embodiment, at least one first electrode ELT1 and at least one second electrode ELT2 may be disposed in the emission area EA of each of the sub-pixels SPX. For example, one first electrode ELT1 may be disposed in a center of the emission area EA, and two second electrodes ELT2 may be disposed on both sides of the first electrode ELT1. The second electrodes ELT2 may be integrally or non-integrally connected to each other and may receive the same signal or power. The number, shape, size, and/or position of each of the first and second electrodes ELT1 and ELT2 disposed in each light emission area EA may be variously changed according to an embodiment.

In an embodiment, at least one of the first electrodes ELT1 and the second electrodes ELT2 may also be disposed in the driving circuit area DRA. For example, the second electrodes ELT2 electrically connected to the second pixel power line PL2 may also be disposed in the driving circuit area DRA to shield or reduce a coupling action that may be generated by the driving elements DRE. In an embodiment, the second electrodes ELT2 may be formed in the driving circuit area DRA in a shape similar to that of the pixel area PXA, but embodiments are not limited thereto.

Each of the first and second electrodes ELT1 and ELT2 may be formed as a single layer or multiple layers. For example, the first and second electrodes ELT1 and ELT2 may include a reflective electrode layer including a reflective conductive material (for example, metal). The first and second electrodes ELT1 and ELT2 may selectively further include at least one of a transparent electrode layer disposed on and/or under or below the reflective electrode layer, and a conductive capping layer covering or overlapping an upper portion of the reflective electrode layer and/or the transparent electrode layer.

The first insulating layer INS1 may be disposed on the first and second electrodes ELT1 and ELT2. In an embodiment, the first insulating layer INS1 may include contact holes (for example, third and fourth contact holes CH3 and CH4 of FIG. 17) for connecting the first and second electrodes ELT1 and ELT2 to the first and second contact electrodes CNE1 and CNE2, respectively. In an embodiment, the first insulating layer INS1 may be entirely formed on the display area DA in which the first and second electrodes ELT1 and ELT2 are formed, and may include openings exposing a portion of each of the first and second electrodes ELT1 and ELT2. In an area in which the contact holes are formed in the first insulating layer INS1 (or in an area in which the first insulating layer INS1 is opened), the first and second electrodes ELT1 and ELT2 may be electrically connected to the first and second contact electrodes CNE1 and CNE2, respectively. In an embodiment, the first insulating layer INS1 may be locally disposed only under or below an area in which the light emitting elements LD may be arranged (or disposed).

The first insulating layer INS1 may be a single layer or multiple layers, and may include at least one inorganic insulating material and/or organic insulating material. In an embodiment, the first insulating layer INS1 may include at least one type of inorganic insulating material including silicon nitride (SiNx), silicon oxide (SiOx), or silicon oxynitride (SiOxNy).

As the first and second electrodes ELT1 and ELT2 are covered or overlapped by the first insulating layer INS1, damage to the first and second electrodes ELT1 and ELT2 in a subsequent process may be prevented. An occurrence of a short defect due to an improper connection between the first and second electrodes ELT1 and ELT2 and the light emitting elements LD may be prevented.

The first bank BNK1 may be disposed on the display area DA in which the first and second electrodes ELT1 and ELT2 and the first insulating layer INS1 are formed. The first bank BNK1 may have openings corresponding to the emission areas EA of the sub-pixels PXL, and may be formed in a non-emission area NEA to surround the emission areas EA of the sub-pixels SPX. Accordingly, each emission area EA to which the light emitting elements LD are to be supplied may be defined (or partitioned). In an embodiment, the first bank BNK1 may include a light blocking and/or reflective material including a black matrix material or the like within the spirit and the scope of the disclosure. Accordingly, light interference between the sub-pixels SPX may be prevented.

The light emitting elements LD may be supplied to each emission area EA surrounded by the first bank BNK1. The light emitting elements LD may be aligned between the first and second electrodes ELT1 and ELT2 by first and second alignment signals applied to each first electrode ELT1 (or a first alignment line before being separated into the first electrode ELT1 of each of the sub-pixels SPX) and each second electrode ELT2 (or a second alignment line formed by the second electrodes ELT2 of the sub-pixels SPX). For example, the light emitting elements LD supplied to each emission area EA may be arranged (or disposed) in the second direction DR2, an oblique direction, or the like so that the first ends EP1 face the first electrode ELT1 and the second ends EP2 face the second electrodes ELT2.

The second insulating layer INS2 (or also referred to as an "insulating pattern") may be disposed on a portion of the light emitting elements LD. For example, the second insulating layer INS2 may be disposed locally on a portion including a central portion of the light emitting elements LD to expose the first and second ends EP1 and EP2 of the light emitting elements LD arranged (or disposed) in the emission area EA of the corresponding sub-pixel SPX. In case that the second insulating layer INS2 is formed on the light emitting elements LD, the light emitting elements LD may be stably fixed, and the first and second contact electrodes CNE1 and CNE2 may be stably separated.

The second insulating layer INS2 may be a single layer or multiple layers, and may include at least one inorganic insulating material and/or organic insulating material. For example, the second insulating layer INS2 may include various types of organic and/or inorganic insulating materials including silicon nitride (SiNx), silicon oxide (SiOx), silicon oxynitride (SiOxNy), aluminum oxide (AlxOy), photoresist (PR) material, and the like within the spirit and the scope of the disclosure.

On both ends of the light emitting elements LD, which are not covered or overlapped by the second insulating layer INS2, for example, on the first and second ends EP1 and EP2, different electrodes among the first contact electrode CNE1, the second contact electrode CNE2, and the intermediate electrode IET may be formed. For example, the first contact electrode CNE1 may be disposed on the first end EP1 of the first light emitting element LD1, and the intermediate electrode IET may be disposed on the second end EP2 of the first light emitting element LD1. The intermediate electrode IET may be disposed on the first end EP1 of the second light emitting element LD2, and the second contact electrode CNE2 may be disposed on the second end EP2 of the second light emitting element LD2.

In FIGS. 15 and 16, the intermediate electrode IET disposed on the second end EP2 of the first light emitting element LD1 and the intermediate electrodes IET disposed on the first end EP1 of the second light emitting element LD2 are separated from each other, but the intermediate electrodes IET may be one intermediate electrode IET connected integrally or non-integrally. For example, in a plan view, the intermediate electrode IET disposed on the second end EP2 of the first light emitting element LD1 and the intermediate electrodes IET disposed on the first end EP1 of the second light emitting element LD2 may be integral with each other.

In FIGS. 15 and 16, the first electrode ELT1 and the first contact electrode CNE1 are separated from each other, but the first electrode ELT1 and the first contact electrode CNE1 may be connected to each other through at least one contact hole (or contact portion) in an area which is not shown. Similarly, in FIGS. 15 and 16, the second electrodes ELT2 and the second contact electrode CNE2 separated from each other, but the second electrodes ELT2 and the second contact electrode CNE2 may be connected to each other through at least one contact hole (or contact portion) in an area which is not shown.

Additionally, in FIGS. 15 and 16, the first transistor M1 and the first electrode ELT1 are separated from each other, but the first transistor M1 and the first electrode ELT1 of each sub-pixel SPX may be connected to each other through at least one contact hole (or contact portion) in an area which is not shown. For example, the first electrodes ELT1 of the sub-pixels SPX may be individually connected to each of the pixel circuits PXC.

The second electrodes ELT2 and the second contact electrodes CNE2 of the sub-pixels SPX may be connected to the second pixel power line PL2 in an area which is not shown. For example, the second electrodes ELT2 of the sub-pixels SPX may be commonly connected to the second pixel power line PL2, and the second contact electrodes CNE2 of the sub-pixels SPX may be electrically connected to the second pixel power line PL2 through each of the second electrodes ELT2.

The intermediate electrode IET of each of the sub-pixels SPX may be connected to the first contact electrode CNE1 of the corresponding sub-pixel SPX through at least one first light emitting element LD1. The intermediate electrode IET of each of the sub-pixels SPX may be connected to the second contact electrode CNE2 of the corresponding sub-pixel SPX through at least one second light emitting element LD2. For example, the intermediate electrode IET of each of the sub-pixels SPX may be electrically connected between the first and second light emitting elements LD1 and LD2 of the corresponding sub-pixel SPX.

The first contact electrode CNE1 may be disposed on the first electrode ELT1 to overlap a portion of the first electrode ELT1, and the second contact electrode CNE2 may be disposed on the second electrode ELT2 to overlap a portion of the second electrode ELT2. The intermediate electrode IET may be disposed on the first electrode ELT1 and the second electrode ELT2 to overlap another portion of each of the first electrode ELT1 and the second electrode ELT2.

The first contact electrode CNE1, the second contact electrode CNE2, and/or the intermediate electrode IET may be formed on the same or different layers. For example, the mutual position and/or formation order of the first contact electrode CNE1, the second contact electrode CNE2, and the intermediate electrode IET may be variously changed according to an embodiment.

In the embodiment of FIG. 15, the intermediate electrode IET may be first formed on the second insulating layer INS2. The intermediate electrode IET may be in contact with or direct contact with the second end EP2 of the first light emitting element LD1 and the first end EP1 of the second light emitting element LD2 to be connected between the first light emitting element LD1 and the second light emitting element LD2, but is not limited thereto. Thereafter, the third insulating layer INS3 may be formed in each emission area EA so as to cover or overlap at least intermediate electrode IET, and the first contact electrode CNE1 and the second contact electrode CNE2 may be formed in each emission area EA in which the third insulating layer INS3 is formed. The first contact electrode CNE1 and the second contact electrode CNE2 may be formed simultaneously or sequentially. The first contact electrode CNE1 may be in contact with or direct contact with the first end EP1 of the first light emitting element LD1 to be connected to the first end EP1 of the first light emitting element LD1, and the second contact electrode CNE2 may be in contact with or direct contact with the second end EP2 of the second light emitting element LD2 to be connected to the second end EP2 of the second light emitting element LD2, but are not limited thereto. The disposition and/or formation order of the intermediate electrode IET and the first and second contact electrodes CNE1 and CNE2 may be changed. As in the embodiment of FIG. 15, in case that the electrodes disposed on the first end EP1 and the second end EP2 of each light emitting element LD are disposed on different layers, the electrodes may be stably separated and a short defect may be prevented.

In the embodiment of FIG. 16, the first contact electrode CNE1, the second contact electrode CNE2, and the intermediate electrode IET may be disposed on a same layer of the display layer DPL, and may be formed simultaneously or sequentially with each other. The third insulating layer INS3 may be omitted. In the embodiment of FIG. 16, as the electrodes disposed on the first ends EP1 and the second ends EP2 of the light emitting elements LD are simultaneously formed on a same layer, a pixel process may be simplified and manufacturing efficiency of the display device DD may be increased.

As in an embodiment of FIG. 6, in case that each sub-pixel SPX may include a single light emitting element LD or may include a light emitting unit EMU of a parallel structure including a single serial stage, the sub-pixel SPX may not include the intermediate electrode IET. The first contact electrode CNE1 may be disposed on the first end(s) EP1 of the light emitting element(s) LD, and the second contact electrode CNE2 may be disposed on the second end(s) of the light emitting element(s) LD.

The first contact electrode CNE1, the second contact electrode CNE2, and the intermediate electrode IET may include at least one conductive material. In an embodiment, the first contact electrode CNE1, the second contact electrode CNE2, and the intermediate electrode IET may include a transparent conductive material to allow light emitted from the light emitting elements LD to pass therethrough.

In an embodiment, the display panel PNL may include a light conversion layer CCL provided (or disposed) on the light emitting elements LD. For example, the light conversion layer CCL may be disposed in each emission area EA in which the light emitting elements LD may be arranged (or disposed).

The display panel PNL may further include the second bank BNK2 disposed in the non-emission area NEA to overlap the first bank BNK1. The second bank BNK2 may define (or partition) each emission area EA in which the light conversion layer CCL is to be formed. In an embodiment, the second bank BNK2 may be integrated with the first bank BNK1. The first bank BNK1 and the second bank BNK2 may also be disposed in the driving circuit area DRA between the pixels PXL.

The second bank BNK2 may include a light blocking and/or reflective material including a black matrix material. Accordingly, light interference between the sub-pixels SPX may be prevented. The second bank BNK2 may include a material identical to or different from that of the first bank BNK1.

The light conversion layer CCL may include wavelength conversion particles (or, color conversion particles) converting a wavelength and/or a color of the light emitted from the light emitting elements LD, and/or light scattering particles SCT increasing light output efficiency by scattering the light emitted from the light emitting elements LD. For example, on each light emitting unit EMU, each light conversion layer CCL including the wavelength conversion particles including at least one type of quantum dot QD (for example, a red quantum dot, a green quantum dot, and/or a blue quantum dot), and/or the scattering particles SCT.

For example, in case that any one sub-pixel SPX is set as a red (or green) sub-pixel and blue light emitting elements LD may be provided (or disposed) in the light emitting unit EMU of the sub-pixel SPX, the light conversion layer CCL including the red (or green) quantum dot QD for converting blue light into red (or green) light may be disposed on the light emitting unit EMU of the sub-pixel SPX. The light conversion layer CCL may further include the light scattering particles SCT.

The fourth insulating layer INS4 may be formed on one surface or a surface of the base layer BSL including the light emitting units EMU and/or the light conversion layers CCL of the sub-pixels SPX. For example, the fourth insulating layer INS4 may be entirely formed in the display area DA.

In an embodiment, the fourth insulating layer INS4 may include an organic and/or inorganic insulating layer, and may substantially planarize a surface of the display layer DPL. The fourth insulating layer INS4 may protect the light emitting units EMU and/or the light conversion layers CCL.

The color filter layer CFL may be disposed on the fourth insulating layer INS4.

The color filter layer CFL may include color filters CF corresponding to colors of the sub-pixels SPX. For example, the color filter layer CFL may include a first color filter CF1 disposed on the first light emitting unit EMU1 of the first sub-pixel SPX1, a second color filter CF2 disposed on the second light emitting unit EMU2 of the second sub-pixel SPX2, and a third color filter CF3 disposed on the third light emitting unit EMU3 of the third sub-pixel SPX3. In an embodiment, the first, second, and third color filters CF1, CF2, and CF3 may be disposed to overlap each other in the non-emission area NEA, the driving circuit area, and the like to block light interference between the sub-pixels SPX. In an embodiment, the first, second, and third color filters CF1, CF2, and CF3 may be formed to be separated from each other on the first, second, and third light emitting units EMU1, EMU2, and EMU3 (for example, the emission area EA of each of the first, second, and third light emitting units EMU1, EMU2, and EMU3), respectively, and a separate light blocking pattern or the like may be disposed between the first, second, and third color filters CF1, CF2, and CF3.

The encapsulation layer ENC may be disposed on the color filter layer CFL. The encapsulation layer ENC may include at least one organic and/or inorganic insulating layer including a fifth insulating layer INS5. The fifth insulating layer INS5 may be entirely formed in the display area DA to cover or overlap the pixel circuit layer PCL, the display layer DPL, and/or the color filter layer CFL.

The fifth insulating layer INS5 may be a single layer or multiple layers, and may include at least one inorganic insulating material and/or organic insulating material. For example, the fifth insulating layer INS5 may include various types of organic or inorganic insulating materials including silicon nitride (SiNx), silicon oxide (SiOx), silicon oxynitride (SiOxNy), aluminum oxide (AlxOy), or the like within the spirit and the scope of the disclosure. In an embodiment, at least one overcoat layer, a filler layer, an upper substrate, and/or the like may be further disposed on the fifth insulating layer INS5.

Figure 17:
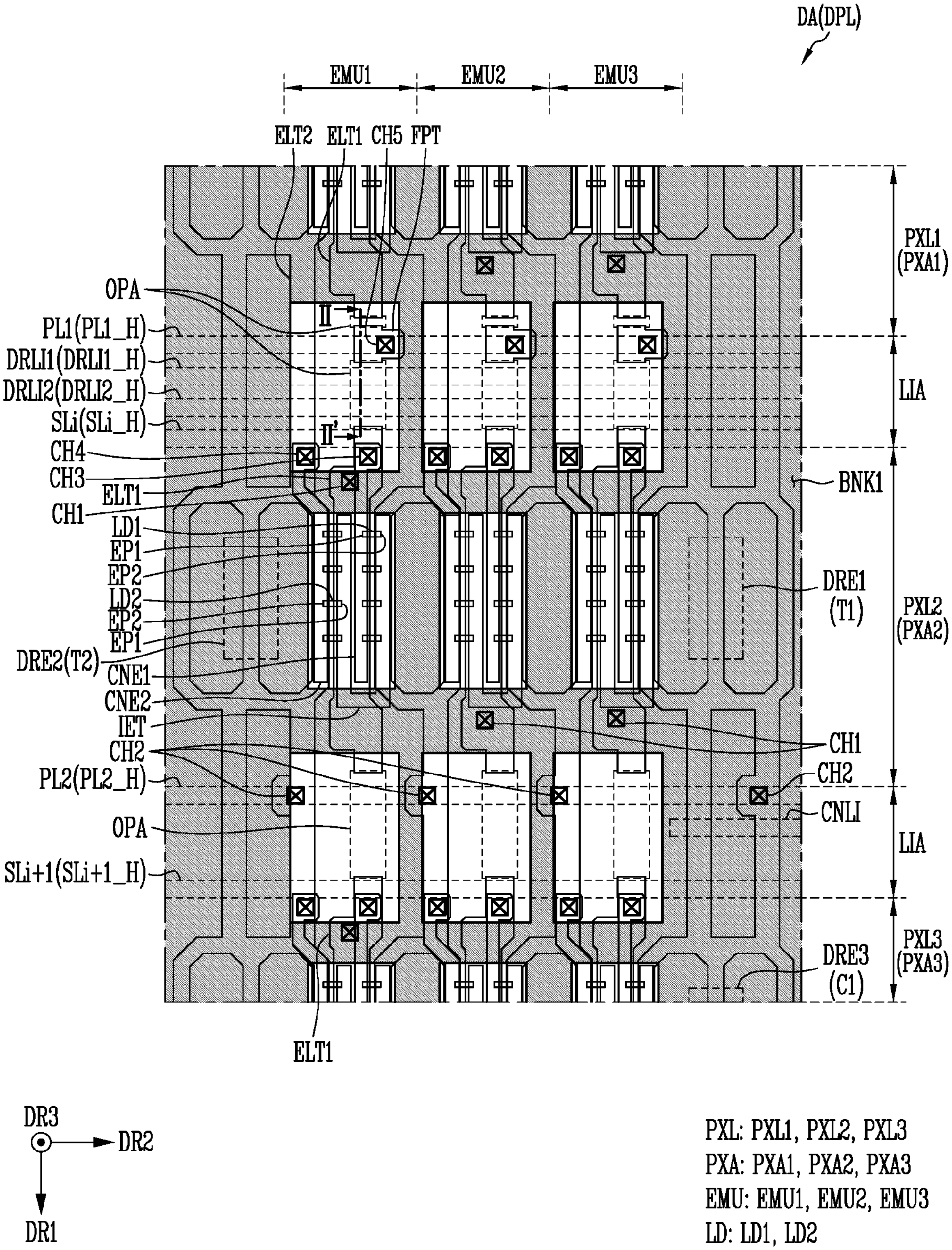
FIG. 17 is a schematic plan view illustrating a display area of a display device according to an embodiment.

FIG. 17 is a schematic plan view illustrating a display area DA of a display device DD according to an embodiment of the disclosure. For example, FIG. 17 illustrates an embodiment of a structure of the display layer DPL based on the second pixel area PXA2 in which the second pixel PXL2 of FIG. 14 is disposed. In FIG. 17, some or a number of configurations (for example, at least one line and/or driving element DRE) formed in the pixel circuit layer PCL to be positioned around the second pixel PXL2 are shown with a dotted line. The pixels PXL including the first, second, and third pixels PXL1, PXL2, and PXL3 may have structures substantially similar or identical to each other. The light emitting units EMU of the sub-pixels SPX forming each pixel PXL may have structures substantially similar or identical to each other.

Figure 18:
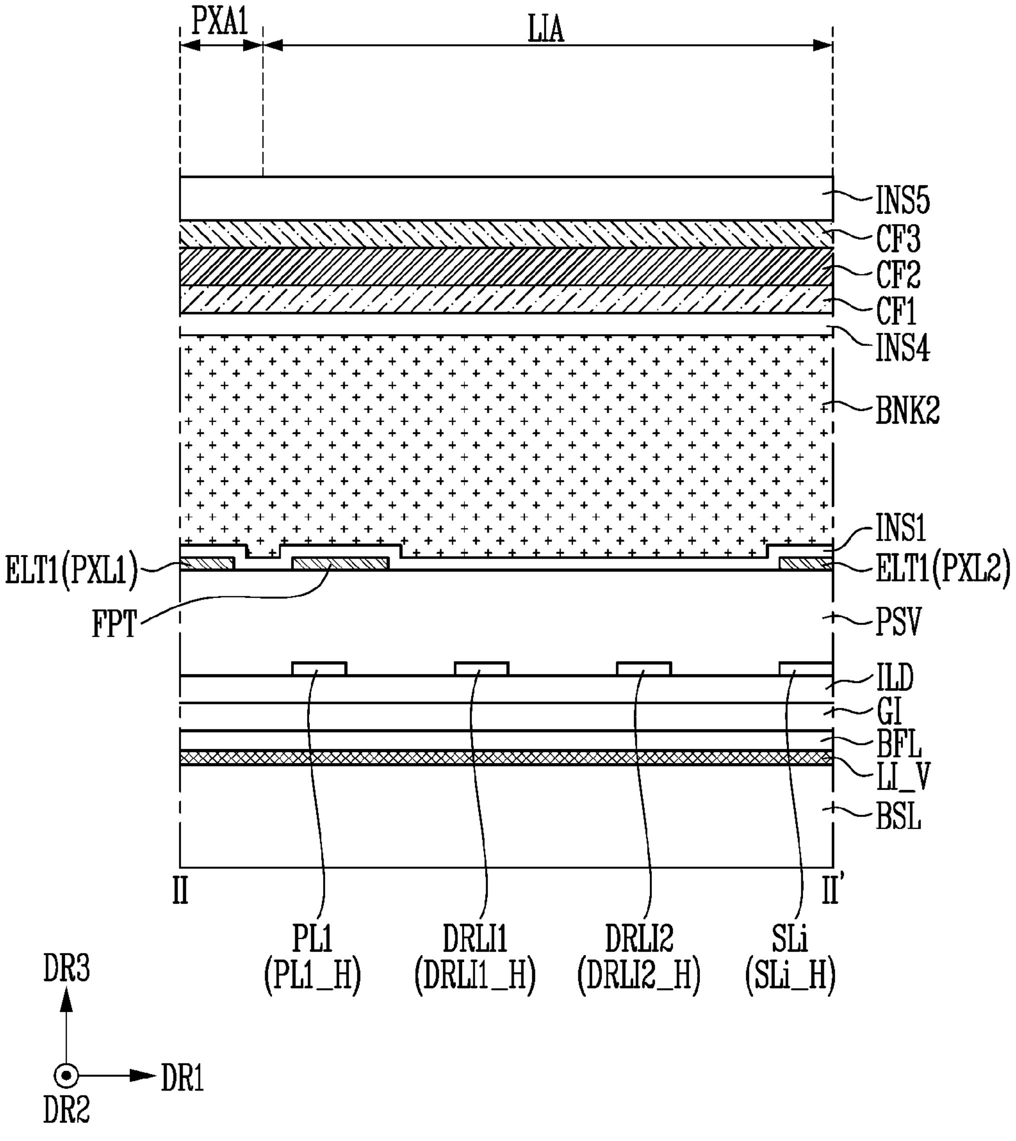
FIG. 18 is a schematic cross-sectional view illustrating a display area of a display device according to an embodiment.

FIG. 18 is a schematic cross-sectional view illustrating a display area DA of a display device DD according to an embodiment. For example, FIG. 18 illustrates an example of a cross section of the display area DA corresponding to line II~II' of FIG. 17.

Referring to FIGS. 1 to 17, each light emitting unit EMU may include at least one first electrode ELT1, at least one second electrode ELT2, at least one light emitting element LD, and the first contact electrode CNE1 and the second contact electrode CNE2. In an embodiment, each light emitting unit EMU may include light emitting elements LD disposed on at least two series stages, and may further include at least one intermediate electrode IET connected between the series stages.

In an embodiment, the light emitting unit EMU may include the first electrode ELT1 positioned at the center of the emission area EA, and second electrodes ELT2 positioned on both sides of the first electrode ELT1. In each pixel area PXA (for example, the emission area EA), the first electrodes ELT1 of each of the light emitting units EMU may extend in the first direction DR1. The second electrodes ELT2 of each of the light emitting units EMU may face each first electrodes ELT1 disposed in the light emitting unit EMU of the corresponding sub-pixel SPX and extend in the first direction DR1. The first and second electrodes ELT1 and ELT2 of each of the sub-pixels SPX may be spaced apart from each other along the second direction DR2.

In an embodiment, the second electrode ELT2 positioned on a left side of the first electrode ELT1 may be integral with the second electrode ELT2 of a neighboring sub-pixel SPX adjacent to the left side of the corresponding sub-pixel SPX (for example, the second electrode ELT2 positioned on the right side of the first electrode ELT1 in the neighboring sub-pixel SPX). Similarly, the second electrode ELT2 positioned on the right side of the first electrode ELT1 may be integral with the second electrode ELT2 of a neighboring sub-pixel SPX adjacent to the right side of the corresponding sub-pixel SPX (for example, the second electrode ELT2 positioned on the left side of the first electrode ELT1 in the neighboring sub-pixel SPX). In an embodiment, the second electrodes ELT2 disposed in the display area DA may be integrally or non-integrally connected to each other in and/or around the display area DA.

The first electrode ELT1 of each of the sub-pixels SPX may be disposed in the display layer DPL to be positioned between the pixel circuit layer PCL and each first contact electrode CNE1. The first electrode ELT1 of each of the sub-pixels SPX may be individually connected to the pixel circuit PXC of the corresponding sub-pixel SPX disposed in the pixel circuit layer PCL through first contact hole CH1, and may be connected to the first contact electrode CNE1 of the corresponding sub-pixel SPX through each third contact hole CH3. Accordingly, the pixel circuit PXC of each sub-pixel SPX may be electrically connected to the first contact electrode CNE1 of the light emitting unit EMU.

The first electrodes ELT1 of the sub-pixels SPX provided (or disposed) in the display area DA may be first formed to be connected to each other in a pixel manufacturing process. For example, the first electrodes ELT1 may be formed to be integral with floating patterns FPT to form the first alignment line. The floating patterns FPT may be connected to the first pixel power line PL1 of the pixel circuit layer PCL through fifth contact holes CH5. Accordingly, in an alignment process of the light emitting elements LD, the first alignment signal may be supplied to the first alignment line through the first pixel power line PL1. After the alignment process of the light emitting elements LD is completed, the first alignment line may be cut off around the fifth contact holes CH5 to disconnect between the first electrodes ELT1 and the first pixel power line PL1. For example, the first alignment line may be separated into the first electrodes ELT1 of the sub-pixels SPX and the floating patterns FPT, by disconnecting the first alignment line in the disconnection areas OPA (also referred to as "open areas" or "etch areas")

positioned around the floating patterns FPT (for example, at upper and lower areas of the floating patterns FPT). The first electrodes ELT1 of the neighboring sub-pixels SPX may be separated by disconnecting the first alignment line in the disconnection areas OPA positioned in the line area LIA or the like between adjacent pixel rows. Accordingly, the first electrodes ELT1 of the sub-pixels SPX may be separated from each other, and thus the sub-pixels SPX may be individually driven.

The second electrodes ELT2 of the sub-pixels SPX may be disposed in the display layer DPL to be positioned between the pixel circuit layer PCL and each second contact electrode CNE2. The second electrodes ELT2 of the sub-pixels SPX may be spaced apart from each first electrode ELT1 and positioned around the first electrode ELT1.

The second electrodes ELT2 of the sub-pixels SPX may be electrically connected to the second pixel power line PL2 through second contact holes CH2. The second electrodes ELT2 of the sub-pixels SPX may be integrally or non-integrally connected to each other, and may be commonly connected to the second pixel power line PL2. For example, the second electrodes ELT2 of the sub-pixels SPX adjacent to each other in the first direction DR1 and/or the second direction DR2 may be integrated into one integrated electrode or an integrated electrode, and may be electrically connected to the second pixel power line PL2 disposed in the pixel circuit layer PCL through at least one second contact hole CH2.

For example, the second electrodes ELT2 of the sub-pixels SPX sequentially disposed in the first direction DR1 among the sub-pixels SPX of the first pixel PXL1 and the sub-pixels SPX of the second pixel PXL2 may be integrated into one integrated electrode or an integrated electrode, and may be electrically connected to the second pixel power line PL2 through at least one second contact hole CH2. For example, the second electrodes ELT2 of the first sub-pixels SPX1 of the first pixel PXL1, the second pixel PXL2, and the third pixel PXL3 may be integrated into one integrated electrode or an integrated electrode. Similarly, the second electrodes ELT2 of the second sub-pixels SPX2 of the first pixel PXL1, the second pixel PXL2, and the third pixel PXL3 may be integrated into one integrated electrode or an integrated electrode, and the second electrodes ELT2 of the third sub-pixels SPX3 of the first pixel PXL1, the second pixel PXL2, and the third pixel PXL3 may be integrated into one integrated electrode or an integrated electrode.

The second electrodes ELT2 may receive the second alignment signal through the second pixel power line PL2 in the alignment process of the light emitting elements LD. The first alignment signal and the second alignment signal may have different waveforms, potentials and/or phases. Accordingly, an electric field may be formed between the first alignment line and the second electrodes ELT2 (or the second alignment line formed by the second electrodes ELT2), and the light emitting elements LD may be aligned between the first alignment line and the second electrodes ELT2.

In case that the display device DD is actually driven, the voltage of the second pixel power source VSS may be supplied to the second electrodes ELT2 through the second pixel power line PL2. Accordingly, a driving current may flow in each sub-pixel SPX.

The first electrodes ELT1 and the second electrodes ELT2 may extend along the first direction DR1 in each of the emission areas EA and may be spaced apart from each other along the second direction DR2. However, the shape, size, number, position, mutual disposition structure, and/or the like of the first electrodes ELT1 and the second electrodes ELT2 may be variously changed according to an embodiment.

The first bank BNK1 may be disposed in the display area DA in which the first electrodes ELT1 and the second electrodes ELT2 are disposed. The first bank BNK1 may be disposed to surround the emission area EA of each of the sub-pixels SPX. The first bank BNK1 may include openings positioned in at least one area of the line area LIA disposed between the pixels PXL adjacent to each other in the first direction DR1. For example, the first bank BNK1 may include the disconnection areas OPA positioned between the first electrodes ELT1 of the pixels PXL and/or the sub-pixels SPX adjacent in the first direction DR1, and openings corresponding to a peripheral area thereof.

The light emitting elements LD may be aligned between the first electrode ELT1 and the second electrodes ELT2 in each emission area EA. A case where the light emitting elements LD are disposed and/or aligned between the first and second electrodes ELT1 and ELT2 may mean that at least a portion of each of the light emitting elements LD is positioned in an area between the first and second electrodes ELT1 and ELT2 in a plan view. Each light emitting element LD may or may not overlap the first electrode ELT1 and/or the second electrode ELT2 positioned around each light emitting element LD. In an embodiment, each light emitting element LD may include the first end EP1 electrically connected to the first electrode ELT1 and the second end EP2 electrically connected to the second electrode ELT2.

In an embodiment, the light emitting elements LD may be prepared in a dispersed form in a solution (for example, a light emitting element mixture liquid or a light emitting element ink), and may be supplied to each emission area EA through an inkjet method or a slit coating method. In case that the first and second alignment signals are applied to the first and second electrodes ELT1 and ELT2 (or the first and second alignment lines) of the sub-pixels SPX, respectively, in a state in which the light emitting elements LD are supplied to each emission area EA, the light emitting elements LD are aligned between the first and second electrodes ELT1 and ELT2. After the light emitting elements LD are aligned, a solvent may be removed through a drying process or the like within the spirit and the scope of the disclosure.

In an embodiment, the light emitting elements LD may include the first light emitting elements LD1 aligned between the first electrode ELT1 and any one second electrodes ELT2 (for example, the second electrode ELT2 positioned on the right side of the first electrode ELT1), and the second light emitting elements LD2 aligned between the first electrode ELT1 and another second electrode ELT2 (for example, the second electrode ELT2 positioned on the left side of the first electrode ELT1). The first contact electrode CNE1 may be disposed on the first ends EP1 of the first light emitting elements LD1, and the intermediate electrode IET may be disposed on the second ends EP2 of the first light emitting elements LD1. The intermediate electrode IET may be disposed on the first ends EP1 of the second light emitting elements LD2, and the second contact electrode CNE2 may be disposed on the second ends EP2 of the second light emitting elements LD2.

Each first contact electrode CNE1 may be disposed on the first ends EP1 to be electrically connected to the first ends EP1 of the first light emitting elements LD1 aligned in the corresponding emission area EA. In an embodiment, each first contact electrode CNE1 may be electrically connected to each first electrode ELT1 through at least one third contact hole CH3, may be electrically connected to the pixel circuit PXC of the corresponding sub-pixel SPX through the first electrode ELT1, and may be electrically connected to the first pixel power line PL1 through the pixel circuit PXC.

Each intermediate electrode IET may be disposed on the second ends EP2 of the first light emitting elements LD1 and the first ends EP1 of the second light emitting elements LD2 to be electrically connected to the second ends EP2 of the first light emitting elements LD1 and the first ends EP1 of the second light emitting elements LD2 aligned in the corresponding emission area EA. Each intermediate electrode IET may be electrically connected to the first and second contact electrodes CNE1 and CNE2 through the first and second light emitting elements LD1 and LD2.

Each second contact electrode CNE2 may be disposed on the second ends EP2 of the second light emitting elements LD2 to be electrically connected to the second ends EP2 of the second light emitting elements LD2 aligned in the corresponding emission area EA. Each second contact electrode CNE2 may be electrically connected to each second electrode ELT2 through at least one fourth contact hole CH4, and may be electrically connected to the second pixel power line PL2 through the second electrode ELT2.

Referring to FIGS. 1 to 18, the first electrodes ELT1 of the sub-pixels SPX may not overlap the driving lines DRLI and/or the connection line CNLI. For example, the first electrodes ELT1 of the sub-pixels SPX included in the first pixel PXL1 and the first electrodes ELT1 of the sub-pixels SPX included in the second pixel PXL2 may be spaced apart from each other by a distance equal to or greater than a width of the first driving line DRLI1 in the first direction DR1 and may not overlap the first driving line DRLI1. The first electrodes ELT1 of the sub-pixels SPX included in the first pixel PXL1 and the first electrodes ELT1 of the sub-pixels SPX included in the second pixel PXL2 may be spaced apart from each other by a distance equal to or greater than a width of the second driving line DRLI2 in the first direction DR1, and may not overlap the second driving line DRLI2.

For example, the first electrodes ELT1 of the sub-pixels SPX disposed sequentially in the first direction DR1 among the sub-pixels SPX of the first pixel PXL1 and the sub-pixels SPX of the second pixel PXL2 may be spaced apart from each other in the first direction DR1 with the first driving line DRLI1 and the second driving line DRLI2 interposed therebetween, and may not overlap the first driving line DRLI1 and the second driving line DRLI1.

In an embodiment, the first electrodes ELT1 of the pixels PXL and/or the sub-pixels SPX adjacent to each other in the first direction DR1 may be spaced apart from each other by a sufficient distance in the line area LIA in which the driving lines DRLI and the connection lines CNLI are disposed so as not to overlap the driving lines DRLI and the connection lines CNLI. For example, in a process of etching the first alignment line to separate the first alignment line into the first electrodes ELT1 and the floating patterns FPT of the sub-pixels SPX, an etch area of the first alignment line may be extended so that the first electrodes ELT1 of the sub-pixels SPX do not overlap the driving lines DRLI and the connection lines CNLI.

In an embodiment, the bank pattern BNP (for example, the bank pattern BNP of FIGS. 15 and 16) may not be provided (or disposed) in the line area LIA or the like, but embodiments are not limited thereto. In an embodiment, the first driving line DRLI1 and the second driving line DRLI2 may overlap at least one line LI_V (for example, at least one line crossing or intersecting the first driving line DRLI1 and the second driving line DRLI2 among the pixel lines PXL1) disposed in the first conductive layer of the pixel circuit layer PCL and extending in the first direction DR1.

According to the above-described embodiment, the driving elements DRE of the driving circuit (for example, the scan driver SDR and/or the gate driver GDR including the same) may be disposed between the pixels PXL. Accordingly, the manufacturing cost of the display device DD may be reduced and the non-display area NA may be reduced.

According to the above-described embodiment, the first electrodes ELT1 of the pixels PXL may be disposed and/or formed so that the first electrodes ELT1 of the pixels PXL and the lines of the driving circuit (for example, the driving lines DRLI connected to the driving elements DRE and the connecting lines) do not cross or intersect each other. For example, the first electrodes ELT1 of the pixels PXL may be formed so that at least a portion of the lines (for example, each of the driving lines DRLI for transmitting any one of the clock signal CLK, the start pulse STVP, and/or the carry signal, and each of the connection lines CNLI extending in the second direction DR2 in one area of the display area DA and connecting at least two driving elements DRE) of the driving circuit that crosses or intersects the line area LIA between the pixels PXL, which are adjacent in the first direction DR1, in the second direction DR2 does not overlap the first electrodes ELT1 of the pixels PXL adjacent in the first direction DR1.

Accordingly, a parasitic capacitance that may be formed between the first electrodes ELT1 of the pixels PXL and the lines of the driving circuit may be reduced or prevented. A deviation of a parasitic capacitance formed in the pixels PXL and/or the sub-pixels SPX may be reduced or prevented. Accordingly, a characteristic deviation between the pixels PXL and/or the sub-pixels SPX may be reduced or prevented, and image quality of the display device DD may be improved.

Although the disclosure has been described in detail in accordance with the above-described embodiment, it should be noted that the above-described embodiment is for the purpose of description and not of limitation. In addition, those skilled in the art will understand that various modifications are possible within the scope of the disclosure.

The scope of the disclosure is thus not limited to the details described in the detailed description of the specification, but should also be defined by the claims. In addition, it is to be construed that all changes or modifications derived from the meaning and scope of the claims and equivalents thereof are included in the scope of the disclosure.

What is claimed is:

1. A display device comprising:
pixels including:
a first pixel; and
a second pixel sequentially disposed in a first direction, each of the first pixel and the second pixel including sub-pixels, each of the sub-pixels including:
a first electrode;
a second electrode; and
a light emitting element;
a driving circuit including driving elements disposed between the pixels;
pixel lines electrically connected to the pixels; and
driving lines electrically connected to the driving elements, wherein
the driving lines are disposed in an area between the first pixel and the second pixel, the driving lines including a first driving line extending in a second direction intersecting the first direction in the area between the first pixel and the second pixel, the first electrode included in each of the sub-pixels of the first pixel is spaced apart from the first electrode included in each of the sub-pixels of the second pixel by a distance equal to or greater than a width of the first driving line in the first direction, and the first electrode included in each of the sub-pixels of the first pixel and the first electrode included in each of the sub-pixels of the second pixel do not overlap the first driving line in a plan view.

2. The display device according to claim 1, wherein the first electrodes of the sub-pixels are electrically connected to pixel circuits of the sub-pixels, respectively.

3. The display device according to claim 1, wherein the first electrodes of the sub-pixels extend in the first direction in pixel areas.

4. The display device according to claim 3, wherein second electrodes of the sub-pixels extend in the first direction and face the first electrodes of the sub-pixels, respectively, and the second electrodes of the sub-pixels are commonly electrically connected to a pixel power line.

5. The display device according to claim 4, wherein the second electrodes of adjacent ones of the sub-pixels in the first direction are an integrated electrode.

6. The display device according to claim 1, wherein the driving lines include a second driving line disposed around the first driving line, passing through the area between the first pixel and the second pixel, and extending in the second direction in the area between the first pixel and the second pixel.

7. The display device according to claim 6, wherein the first electrodes of the sub-pixels sequentially disposed in the first direction are spaced apart from each other with the first driving line and the second driving line disposed between the first electrodes of the sub-pixels in the first direction, and the first electrodes of the sub-pixels sequentially disposed in the first direction do not overlap the first driving line and the second driving line in a plan view.

8. The display device according to claim 6, wherein each of the first driving line and the second driving line is in a mesh line including a first sub-line extending in the first direction and a second sub-line extending in the second direction.

9. The display device according to claim 6, wherein the driving circuit includes a first driving element and a second driving element disposed around the first pixel and the second pixel.

10. The display device according to claim 9, wherein the first driving line is electrically connected to the first driving element, and the second driving line is electrically connected to the second driving element.

11. The display device according to claim 1, wherein the pixel lines include scan lines and data lines of the pixels, and the driving circuit includes a scan driver including stage circuits electrically connected to the scan lines.

12. The display device according to claim 11, wherein the driving elements include transistors and capacitors forming the stage circuits, and are distributed in an area between the pixels.

13. The display device according to claim 11, wherein the driving lines include input signal lines and power lines of the scan driver.

14. The display device according to claim 13, wherein each of the driving lines is disposed in at least one of an area between at least two adjacent ones of the pixels in the first direction or an area between at least two adjacent ones of the pixels in the second direction.

15. The display device according to claim 1, further comprising:

a connection line electrically connected between at least two driving elements among the driving elements.

16. The display device according to claim 15, wherein the connection line passes through an area between at least two adjacent ones of the pixels in the first direction, and the connection line extends in the second direction.

17. The display device according to claim 16, wherein the first electrodes of the pixels disposed around the connection line do not overlap the connection line in a plan view.

18. The display device according to claim 1, wherein each of the driving elements is disposed between at least two adjacent ones of the pixels in the second direction.

19. The display device according to claim 1, wherein the first electrode and the second electrode of each of the sub-pixels extend in the first direction and are spaced apart from each other in the second direction, and the light emitting element of each of the sub-pixels includes:

a first end electrically connected to the first electrode; and a second end electrically connected to the second electrode.

20. A display device comprising:

pixels each including:

a sub-pixel including:

a first electrode;

a second electrode; and a light emitting element disposed between the first electrode and the second electrode;

scan lines electrically connected to the pixels;

a scan driver including driving elements disposed between the pixels, the scan driver outputting scan signals to the scan lines; and driving lines electrically connected to the driving elements, wherein the driving lines include a first driving line passing through an area between two adjacent ones of the pixels in a first direction and extending in a second direction intersecting the first direction, and first electrodes of the two adjacent ones of the pixels in the first direction are spaced apart from each other by a distance equal to or greater than a width of the first driving line in the first direction and do not overlap the first driving line in a plan view.

* * * * *